(12) United States Patent
Higashi et al.

(10) Patent No.: US 7,692,292 B2
(45) Date of Patent: Apr. 6, 2010

(54) PACKAGED ELECTRONIC ELEMENT AND METHOD OF PRODUCING ELECTRONIC ELEMENT PACKAGE

(75) Inventors: Kazushi Higashi, Osaka (JP); Shinji Ishitani, Hyogo (JP)

(73) Assignee: Panasonic Corporation, Osaka (JP)

( * ) Notice: Subject to any disclaimer, the term of this patent is extended or adjusted under 35 U.S.C. 154(b) by 870 days.

(21) Appl. No.: 10/581,792

(22) PCT Filed: Dec. 2, 2004

(86) PCT No.: PCT/JP2004/017931

§ 371 (c)(1),
(2), (4) Date: Jun. 2, 2006

(87) PCT Pub. No.: WO2005/055317

PCT Pub. Date: Jun. 16, 2005

(65) Prior Publication Data

US 2007/0108634 A1     May 17, 2007

(30) Foreign Application Priority Data

| Dec. 5, 2003 | (JP) | ............................. 2003-407232 |
| Dec. 9, 2003 | (JP) | ............................. 2003-410046 |
| Dec. 18, 2003 | (JP) | ............................. 2003-420643 |

(51) Int. Cl.
*H01L 23/10* (2006.01)

(52) U.S. Cl. ........................ 257/710; 257/704; 257/723; 257/773; 257/E23.018; 257/E23.181; 257/E23.191; 438/106

(58) Field of Classification Search .................. 257/704, 257/710, 924, 723, E23.001–E23.194, 711–713; 438/106, 109, 118, 119, 455, 456, 771, 772, 438/776, 777, 927, FOR. 368, FOR. 426
See application file for complete search history.

(56) References Cited

U.S. PATENT DOCUMENTS 5,477,081 A * 12/1995 Nagayoshi .................. 257/678

(Continued)

FOREIGN PATENT DOCUMENTS

EP     1 311 072     5/2003

(Continued)

OTHER PUBLICATIONS

Patent Cooperation Treaty (PCT) International Preliminary Report on Patentability, issued Jul. 27, 2006 in International Application No. PCT/JP2004/017931.

*Primary Examiner*—Jasmine J Clark
(74) *Attorney, Agent, or Firm*—Wenderoth, Lind & Ponack L.L.P.

(57) ABSTRACT

A first container member (9, 109, 212) mounting an electronic device (71, 171, 261) thereon and a second container member (2, 102, 202) are bonded with an adhesive (3, 103) or a metal layer (103, 251). Thus an inner space (90, 190, 211) is formed and the electronic device can be closed in the inner space at a low temperature. In the case the adhesive is used, an exposed surface of the adhesive is coated with a metal film (4) to improve the closeness of the inner space. Further, an electronic device (261, 272) may be mounted on the second container member so as to increase the electronic device arrangement density in a packaged electronic device.

5 Claims, 13 Drawing Sheets

U.S. PATENT DOCUMENTS

| | | | |
|---|---|---|---|
| 5,883,425 A * | 3/1999 | Kobayashi | 257/678 |
| 5,949,137 A * | 9/1999 | Domadia et al. | 257/712 |
| 6,294,831 B1 | 9/2001 | Shishido et al. | |
| 6,969,639 B2 * | 11/2005 | Cho et al. | 438/118 |
| 2004/0169020 A1 | 9/2004 | Yamauchi | |

FOREIGN PATENT DOCUMENTS

| | | |
|---|---|---|
| JP | 54-114569 | 8/1979 |
| JP | 59-129447 | 7/1984 |
| JP | 61-278198 | 12/1986 |
| JP | 2-303676 | 12/1990 |
| JP | 4-148559 | 5/1992 |
| JP | 5-206307 | 8/1993 |
| JP | 6-132455 | 5/1994 |
| JP | 6-224318 | 8/1994 |
| JP | 8-130288 | 5/1996 |
| JP | 9-10963 | 1/1997 |
| JP | 9-35230 | 2/1997 |
| JP | 11-237401 | 8/1999 |
| JP | 2000-40585 | 2/2000 |
| JP | 2000-150695 | 5/2000 |
| JP | 2000-340687 | 12/2000 |
| JP | 2001-127588 | 5/2001 |
| JP | 2003-110402 | 4/2003 |
| JP | 2003-142972 | 5/2003 |
| JP | 2003-224325 | 8/2003 |
| JP | 2003-309226 | 10/2003 |
| JP | 2003-318217 | 11/2003 |
| WO | 02/15423 | 2/2002 |

* cited by examiner

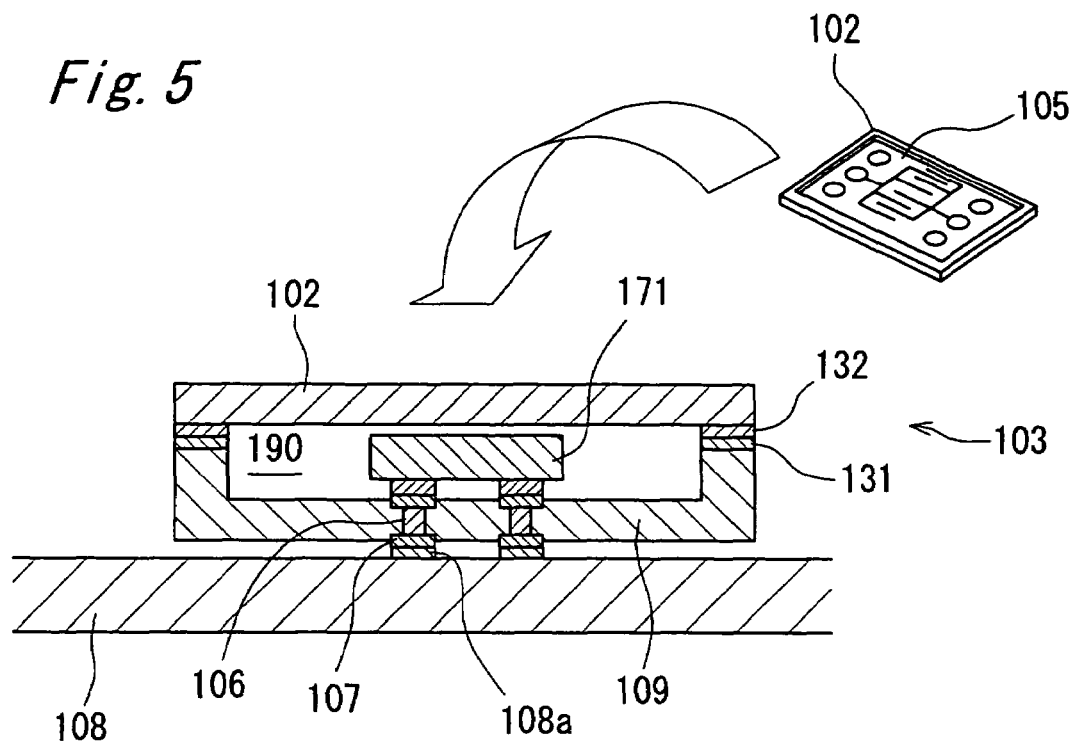
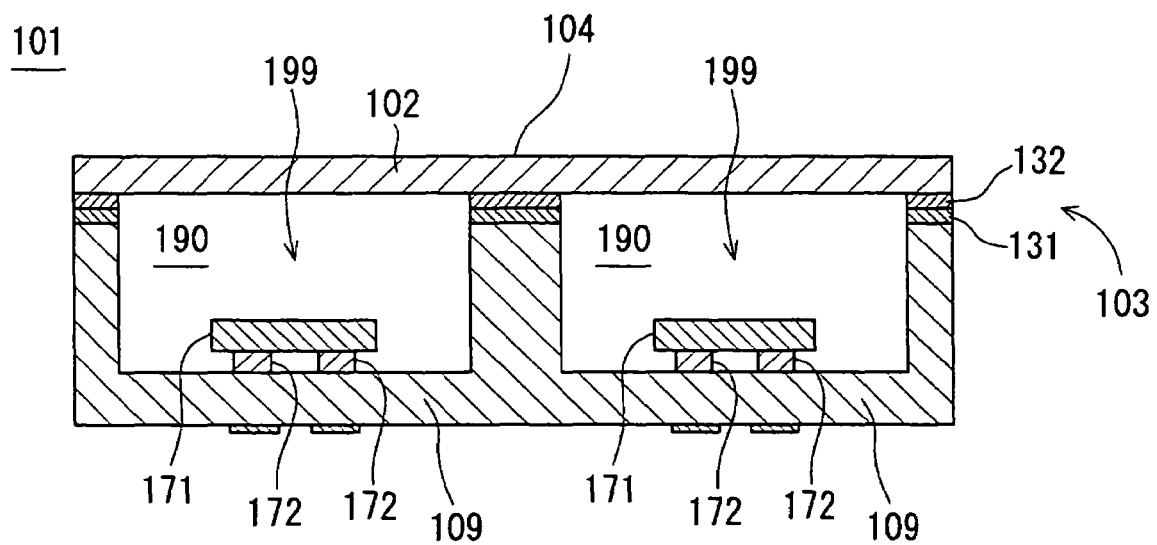

PACKAGED ELECTRONIC ELEMENT AND METHOD OF PRODUCING ELECTRONIC ELEMENT PACKAGE

TECHNICAL FIELD

The present invention relates to a packaged electronic device comprising an electronic device in a closed inner space and its manufacturing method.

BACKGROUND ART

Conventionally, techniques for housing an electronic device in the inside of a container, closing the container, and thus sealing the electronic device have been known as means for protecting a semiconductor device, a surface acoustic wave device, and other various electronic devices from effects of moisture and oxygen, etc. contained in atmospheric air. With respect to a device comprising such an electronic device sealed in the inside space, a variety of techniques for preventing water or the like from penetrating by improving the air-tightness (close-ability) of the container inside have been proposed.

Japanese Patent Laid-Open (JP-A) No. 11-237401 discloses a technique for sealing a sensor chip by sealing a groove for leading out a terminal plate outside of a housing, successively degassing the inside of the housing, and thermally press bonding a sealing hole for the degassing in a case of a semiconductor acceleration sensor. In this connection, in the case the container is made of a metal, a solder may sometimes be used for joining and sealing for members composing the container.

Also, an opening of a ceramic substrate having a cavity (a recessed part) in which an electronic device is mounted in the bottom is covered with a lid made of a metal, and the ceramic substrate and the metal lid are joined and sealed by using a solder or glass powder.

On the other hand, a technique for sealing an electronic device by closing a void formed between an electronic device mounted by flip chip bonding and a substrate is used. For example, in surface acoustic wave device manufacturing, Japanese Patent Laid-Open (JP-A) No. 2003-142972 discloses a technique for sealing a plurality of surface acoustic wave devices with a resin having a high viscosity by applying the resin to the surface acoustic wave devices in two steps and thereby, suppressing entrainment of foams. In manufacturing of a surface acoustic wave device, Japanese Patent Laid-Open (JP-A) No. 2003-110402 discloses a technique of using a low melting point glass for sealing a surface acoustic wave chip bonded on a package substrate by a flip chip and thereby obtaining higher air-tightness than that in the case of using a resin. In production for storing an electron circuit module comprising a circuit part into a closed space, Japanese Patent Laid-Open (JP-A) No. 61-278198 discloses a technique of advantageously utilizing a space of the inside of a case by fitting a hard circuit substrate in a manner that the face on which a circuit part is mounted is set inside in a box type case in which a flexible circuit substrate bearing a circuit part such as a resistor, a capacitor or the like is stuck to the inner face.

DISCLOSURE OF INVENTION

Subject to be solved by the Invention

Since resin does not have so high air-tightness quality to moisture or oxygen, if resin is used as a sealing material, depending on the types of electronic devices, sealing or packaging may not be carried out properly. In the case of sealing by using the low melting point glass as disclosed in the above-mentioned Japanese Patent Laid-Open (JP-A) No. 2003-110402 or in the case of joining members composing a container by using a solder or glass powder, high air-tightness can be achieved. However it requires heating treatment for melting the low melting point glass or solder at a temperature, for example, as high as about 260° C. and therefore it is not suitable for sealing an electronic device with low heat resistance. Particularly, in the case of an electronic device of a compound semiconductor, since the heat resistance thereof is low, the device is highly possibly damaged by high temperature heating.

In the case the container inside is closed and sealing by the heating treatment as described, since a material of a lid composing the container is also required to have high heat resistance, it becomes difficult to use a resin or the like for the material and thus cost reduction of the container is limited.

Along with the recent tendency of compact electronic appliances, an electronic device has been made smaller and smaller and accordingly, it has been required for very small electronic devices to be arranged more densely. With respect to the electronic circuit module disclosed in the above-mentioned Japanese Patent Laid-Open (JP-A) No. 61-278198, since the flexible circuit substrate is to be housed in the inside of the box type case, the flexible circuit substrate is made thick relative to very small electronic components such as a bare chip or the like of an IC and accordingly, it becomes very difficult to satisfy dense arrangement of devices and fabrication of a compact package along with the requirement for electronic devices to be made very small.

In view of the above state of the art, it is an object of the present invention to provide a packaged electronic device to be housed in a closed space at a low temperature, preferably in a range from a room temperature to 150° C., and more particularly to provide a package electronic device suitable for highly dense arrangement of a very small electronic device, and a manufacturing method of such a packaged electronic device.

Means for Solving the Invention

A packaged electronic device of a first aspect of the present invention comprises:
an electronic device;
a first container member configured to mount said electronic device therein;
a second container member configured to form a space for housing said electronic device in cooperation with said first container member;
an adhesive configured to close the space by bonding said first container member and said second container member; and
a metal film configured to cover an exposed face of said adhesive.

A manufacturing method of a packaged electronic device of a second aspect of the present invention comprises:
bonding a first container member on which an electronic device is mounted and a second container member configured to form a space for housing said electronic device in cooperation with said first container member with an adhesive so as to close the space; and
covering an exposed face of said adhesive with a metal film.

A packaged electronic device of a third aspect of the present invention comprises:

an electronic device;

a first container member configured to mount the electronic device thereon;

a second container member configured to form a space for housing said electronic device in cooperation with said first container member; and a metal layer configured to close said space by bonding said first container member and said second container member, to be formed by radiating an energy wave to a first metal part of said first container member and a second metal part of said second container member and bringing said first metal part and said second metal part into contact with each other.

A manufacturing method of a packaged electronic device of a fourth aspect of the present invention comprises:

bonding a first container member on which an electronic device is mounted and a second container member configured to form a space for housing said electronic device in cooperation with said first container member with a metal layer for closing the space;

when said bonding, radiating an energy wave to a first metal part of said first container member and a second metal part of said second container member; and forming said metal layer by bringing said first metal part and said second metal part radiated with said energy wave into contact with each other.

A packaged electronic device of a fifth aspect of the present invention comprises:

a container configured to form a closed inner space by a first inner face, a second inner face opposed to said first inner face, and side faces perpendicular to said first inner face and said second inner face;

a first electronic device to be mounted on a first mounting face of said first inner face, second inner face, or side faces;

a second electronic device to be mounted on a second mounting face different from said first mounting face of said first inner face, second inner face, or side faces;

a first outer electrode formed on an outer face of said container facing to said first mounting face and to be electrically connected with said first electronic device; and a second outer electrode formed on an outer face of said container facing to said second mounting face and to be electrically connected with said second electronic device.

Also, a manufacturing method of a packaged electronic device of a sixth aspect of the present invention comprises:

mounting a first electronic device to be connected electrically with a via on a first mounting face of a cover member having the via formed therein;

mounting a second electronic device to be connected electrically with a via on a second mounting face of a main body member having the via formed therein and forming a closed inner space in cooperation with said cover member; and forming a packaged electronic device by bonding said cover member and said main body member so as to arrange said first electronic device and said second electronic device in said inner space and thereby closing said inner space.

EFFECTS OF THE PRESENT INVENTION

According to the above-mentioned first and second aspects, since the first container and the second container are bonded to each other by an adhesive, the electronic device can be housed in a closed space. Also, since the exposed face of the adhesive is covered with the metal film, pin holes are clogged and then gas and water are prevented from penetrating the adhesive. Accordingly, the inner space can be closed at a high reliability.

According to the above-mentioned third and fourth aspects, since the closed inner space is formed by bonding the first container member and the second container member with the metal layer which is formed by coming into contact with the first metal part and the second metal part to each other after the energy wave is radiated to them, the electronic device can be housed in the closed space at a low temperature. Also, since gas, moisture and the like cannot penetrate the metal layer part, the inner space can be reliably closed.

According to the above-mentioned fifth and sixth aspects, since the electronic devices are mounted in the inner faces or side faces of a container forming the inner space and further the outer electrodes to be connected electrically to the electronic devices are formed in the outer face of the container, very small electronic devices can be arranged at a high density.

BRIEF DESCRIPTION OF DRAWINGS

FIG. 5 is a drawing showing the case that an upper cover of the packaged electronic device according to the second embodiment is a semiconductor device.

FIG. 6 is another process drawing showing the fabrication steps of the packaged electronic device of the second embodiment.

EXPLANATION OF REFERENCE NUMERALS

1 packaged electronic device, 2 cover member, 3 adhesive, 3b metal particle, 4 coating, 9 flat substrate, 21 flange, 22 moisture absorbent, 23 recessed part, 71 semiconductor device, 90 inner space,

101 packaged electronic device, 102 cover member, 103 metal layer, 109 substrate, 131 substrate metal part, 132 cover metal part, 171 semiconductor device, 190 inner space,

201, 201a, 201b, 201c packaged electronic device, 202 upper cover member, 203 lower cover member, 204, 204a cylindrical member, 210 container, 211 inner space, 212 cavity substrate, 213 cavity, 221 upper face, 223 outer electrode, 224 via, 231 lower face, 233 outer electrode, 234 via, 241 inner face, 251 metal layer, 261 semiconductor device, 271 semiconductor device, 272 chip part, 2511, 2512 metal part.

BEST MODE FOR CARRYING OUT THE INVENTION

Hereinafter, the embodiments of the present invention will be described and the same reference symbols are assigned to the same parts in the attached drawings.

First Embodiment

Figure 1:
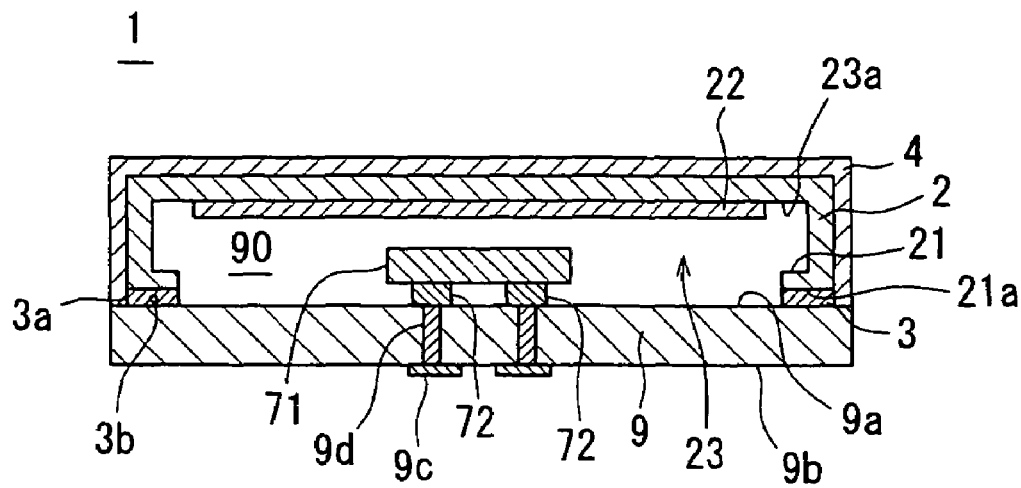
FIG. 1 is a cross-sectional view showing the structure of a packaged electronic device according to the first embodiment of the present invention.

FIG. 1 is a cross-sectional view showing the structure of a packaged electronic device 1 according to one embodiment of the present invention. In this specification, a packaged electronic device does not mean a package itself but a package in which an electronic device is housed and is referred to as an electronic device which is packaged or an electronic device package.

The packaged electronic device 1 is a package in whose inside a semiconductor device 71 as an electronic device is sealed; that is an electronic device installed in a closed space and packaged; and comprises a flat substrate 9, a semiconductor device 71 to be mounted on the substrate 9, and a cover member 2 to be attached to the substrate 9 in a manner that the cover member 2 surrounds the side and upper (on the opposite to the substrate 9) parts of the semiconductor device 71 and accordingly forms a space (hereinafter, referred to as an inner space) 90 for housing the semiconductor device 71 in corporation with the substrate 9. In the following respective embodiments, the above-mentioned electronic device include the above-mentioned semiconductor device formed from a silicon substrate and devices other than the semiconductor device, for example, a ceramic device, sensors, a crystal substrate device, a SAW filter, and the like.

The substrate 9 is a multilayer board where an electrode 9c and the like are formed on a main face 9a on which the semiconductor device 71 is mounted and a rear face 9b of the substrate 9, which is the opposed side of the inner space 90. The substrate 9 is made of a low temperature co-fired ceramic (hereinafter, referred to as "LTCC") and is different from a board made of a common ceramic (to distinguish from LTCC, called as HTCC (a high temperature co-fired ceramic) in the manufacturing process.

The semiconductor device 71 is so-called bare IC chip and is mounted on the substrate 9 by electrically bonding a bump 72 of a metal formed on a land of a down face of the semiconductor device 71 to an electrode on the substrate 9. Electrodes on both front and rear faces of the substrate 9 are electrically connected to each other through vias 9d or the like. In the packaged electronic device 1, by mounting the rear face 9b of the substrate 9 to another substrate, the semiconductor device 71 and another substrate are electrically connected with each other through the electrode 9c.

The cover member 2 is produced in a container-like shape having a recessed part 23 from a resin such as a plastic and attached to the substrate 9 in a manner that the recessed part 23 of the cover member 2 covers the substrate 9 to form an inner space 90. In the rim part of the recessed part 23 of the cover member 2, a flange part 21 inward along the substrate 9 is formed.

In the packaged electronic device 1, the substrate 9 and the flange 21 of the cover member 2 are bonded by an adhesive 3 containing a resin material such as an epoxy resin, an acrylic resin, a phenol resin or the like which is a thermosetting resin to be cured at a temperature of 150° C. or lower, as a main component and particles 3b of silver (Ag), so-called a silver paste to close the inner space 90. In place of the silver particle, metal particles 3b of other metals such as copper (Cu), etc. may be used. The exposed surface 3a of the adhesive 3 and the outer surface of cover member 2 are coated with a coating 4 of nickel (Ni) and gold (Au). The coating 4 is not limited to nickel or gold and may be of another metal. Accordingly, gas and water penetration paths such as pin holes formed in the adhesive 3 can be clogged and air-tightness of the inner space 90 can be maintained. Further, a moisture absorbent 22 of, for example, magnesium oxide may be installed in the inner space 90 while being attached to the cover member 2. Accordingly, the inner space 90 can reliably be dehumidified.

Figure 2:
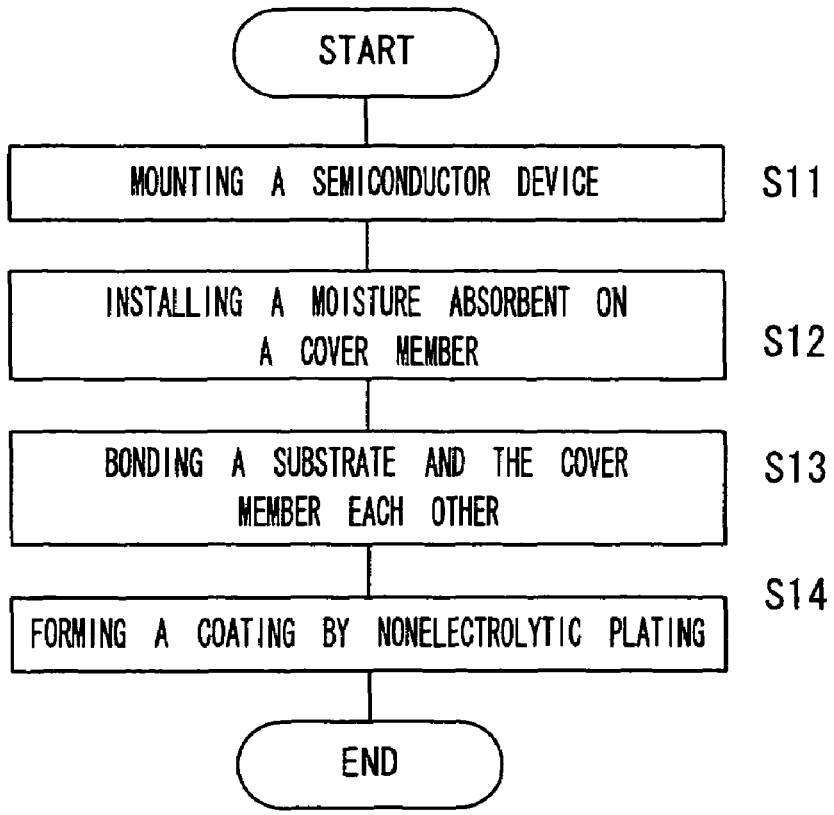
FIG. 2 is a process drawing showing the fabrication steps of a packaged electronic device.

FIG. 2 is a drawing showing the manufacturing process of the packaged electronic device 1. In producing the packaged electronic device 1, at first, in the state that the semiconductor device 71 is mounted on a prescribed mounting position of the substrate 9 and the bump 72 and the electrode of the substrate 9 are brought into contact with each other, the semiconductor device 71 is pressed against the substrate 9 while applying ultrasonic vibration, so that the bump 72 and the electrode are bonded to mount the semiconductor device 71 on the substrate 9 (step S11). The mounting of the semiconductor device 71 can be carried out by other means, for example, an isotropic conductive resin film or a paste, or a non-conductive resin film or a paste may be used for bonding. Further, so-called normal temperature bonding for the bonding by radiating an energy wave to the bump 72 and the electrode of the substrate 9 and then bonding them in vacuum may be employed. Further, the bump 72 may be formed on the electrode of the substrate 9. A plurality of semiconductor devices 71 may be mounted. Devices to be mounted are not necessarily limited to the semiconductor device 71 but other electronic devices as described later.

Successively, the moisture absorbent 22 is attached to the bottom face 23a of the recessed part 23, that is, the face, which is the inside of the cover member 2 and faces to the installed substrate 9 (step S 12).

After that, the adhesive 3 is applied to the adhesion position of the main face 9a of the substrate 9 to which the cover member 2 is bonded and/or the face 21a of the flange part 21 of the cover member 2 which opposes the main face 9a of the substrate 9. The cover member 2 is stuck to the substrate 9 by the adhesive 3. The substrate 9 to which the cover member 2 is stuck is heated at a relatively low temperature of 150° C. or lower, preferably about 120° C. to 130° C. to cure the adhesive and accordingly the substrate 9 and the cover member 2 are bonded to each other to close the inner space 90 (step S 13). Accordingly, the inner space 90 is reliably dehumidified by the moisture adsorbent 22 to improve the moisture-resistance reliability.

Since the flange part 21 of the cover member 2 and the substrate 9 are bonded, the adhesion surface area is wide as compared with that of the case there is no flange part 21. So the bonding of the substrate 9 and the cover member 2 can further be stabilized. As a result, the reliability of the closeness of the inner space 90 can be improved. The flange part 21 may be formed facing outward of the recessed part 23.

Next, after at least the electrode part on the rear face 9b of the substrate 9 is coated with a mask material, nonelectrolytic plating is carried out to the packaged electronic device 1 to successively form a nickel plating layer and a gold plating layer (hereinafter, called as a general name of "plating layer") and thus the surfaces of the mask material and the packaged electronic device 1 are covered. With respect to the packaged electronic device 1, the metal film, which is a plating layer, can be formed easily by using the nonelectrolytic plating. Further, since silver particles are contained in the adhesive 3, the nickel plating layer tends to be grown easily and stably on the surface in the outside of the adhesive 3, in other words, plating is easy to be carried out and the metal film can easily be formed.

On completion of the plating of the packaged electronic device 1, the mask material is removed from the packaged electronic device 1. The plating layer is left only on the portion of the surface other than potions coated with the mask material. Thus the fabrication of the packaged electronic device 1 having the coating 4 of the nickel and gold can completed. (step S14)

As described above, in the case of the packaged electronic device 1, the substrate 9 and the cover member 2 are bonded with the adhesive 3 to be cured at a lower temperature as compared with that in a conventional case of using a solder or glass powder, preferably at a room temperature or higher and 150° C. or lower and accordingly the inner space 90 in which the semiconductor device 71 is housed is closed. As a result, even if the semiconductor device 71 has a low heat resistance, it can be housed in the closed space at a low temperature without being damaged by heat. Further, since the cover member 2 made of a less heat resistant and more economical resin than a ceramic or a metal can be used, the production cost of the packaged electronic device 1 can be saved.

In the packaged electronic device 1, since the outer surface of the adhesive 3, that is, the exposed face 3a, is covered with the coating 4 of the metal, moisture or the like is prevented from penetrating the inner space 90 through the adhesive 3 and as compared with the case that the surface of the adhesive 3 containing the resin as a main component is exposed to outer air, the air tightness of the inner space 90 can be improved. Further, the outer surface of the cover member 2 made of the resin is coated with the coating 4 of the metal, so that the inner space 90 can be closed with a high reliability free from pin holes.

In the packaged electronic device 1, since the semiconductor device 71 mounted on the flat substrate 9 is sealed by the cover member 2 having the recessed part 23 (including a cavity-like shape), a step for forming a cavity corresponding to the recessed part 23 in the substrate 9 can be eliminated. So the production cost of the packaged electronic device 1 can be saved. Particularly, in the case of using the substrate 9 made of LTCC with which the cost for formation of the cavity becomes high as compared with HTCC, the fabrication cost of the packaged electronic device 1 can considerably be saved.

The embodiment of the present invention is described above, however the present invention is not limited to the above embodiment. Various modifications can be made. For example, on completion of the production of the packaged electronic device 1, in the case the moisture content of the gas existing in the inner space 90 is sufficiently low, the moisture absorbent 22 may be omitted.

The cover member 2 is preferable to be produced from a resin in terms of production cost reduction, however it may be made of another material such as a metal or a ceramic, etc. The substrate 9 and the cover member 2 may be a substrate having a cavity, so-called cavity substrate, and a flat cover covering the opening of the cavity. Even in this case, the substrate 9 and the cover member 2 are bonded to each other by the adhesive 3 and the outer surface of the adhesive 3 is coated with the coating 4 made of a metal, so that the packaged electronic device 1 with high air tightness can be produced at a low temperature.

In the case it is desired to avoid heating treatment as much as possible in the fabrication process of the packaged electronic device 1, an adhesive 3 such as a photo-curable resin which can be cured without heating treatment may be used for bonding the substrate 9 and the cover member 2. Even in this case, the coating 4 is formed on the outside surface of the adhesive 3 by nonelectrolytic plating and thus the air-tightness of the inner space 90 can be improved.

Formation of the coating 4 is preferable to be carried out by nonelectrolytic plating from a viewpoint of ease of the process and production cost reduction, however in the case a conductive adhesive is used as the adhesive 3, the formation may be carried out by electroplating. Further, the coating 4 may be formed by sputtering a metal.

Second Embodiment

Figure 3:
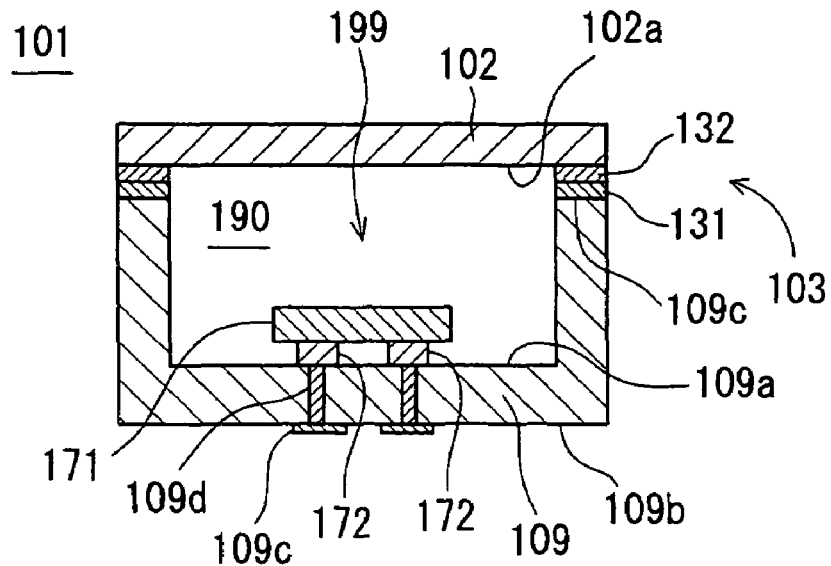
FIG. 3 is a cross-sectional view showing the structure of a packaged electronic device according to the second embodiment.

FIG. 3 is a cross-sectional view showing the structure of a packaged electronic device 101 according to the second embodiment of the present invention. The packaged electronic device 101 is a package in whose inside a semiconductor device 171 as an electronic device is sealed, that is an electronic device installed in a closed space and packaged. The packaged electronic device 101 comprises a substrate 109 having a cavity 199 corresponding to a recessed part, so-called a cavity substrate, a semiconductor device 171 to be mounted on the bottom face of the cavity 199, and a flat plate-like cover member 102 to be attached to the substrate 109 in a manner that the cover member 102 closes the opening of the cavity 199 and accordingly forms a space (hereinafter, referred to as an inner space) 190 for housing the semiconductor device 171 in corporation with the substrate 109.

The substrate 109 and the cover member 102 are made of resins such as plastics. The substrate 109 is a multilayer board composed of a main face 109a corresponding to a bottom face of the cavity 199 where the semiconductor device 171 is mounted and a rear face 109b of the substrate 109 which is the opposed side face to the inner space 190. Electrodes 109c and the like are formed on the main face 109a and the rear face 109b. The semiconductor device 171 is so-called a bare IC chip and mounted on the substrate by electrically connecting a bump 172 of a metal formed on a land in the down face of the semiconductor device 171 with an electrode on the main face 109a of a substrate 109. Electrodes in both the main and rear faces of the substrate 109 are properly electrically connected to each other by a via 109d or the like. The packaged electronic device 101 is mounted on another outer substrate from the substrate 109 side, so that the semiconductor device 171 and the outer substrate are electrically connected through the electrode 109c.

In the packaged electronic device 101, the substrate 109 and the cover member 102 are bonded by a metal layer 103 made of gold (Au), so that the inner space 190 is closed. The metal layer 103 is formed by bonding a substrate metal part 131 corresponding to a first metal part formed on the substrate 109 and a cover metal part 132 corresponding to a second metal part formed on the cover member 102.

Figure 4:
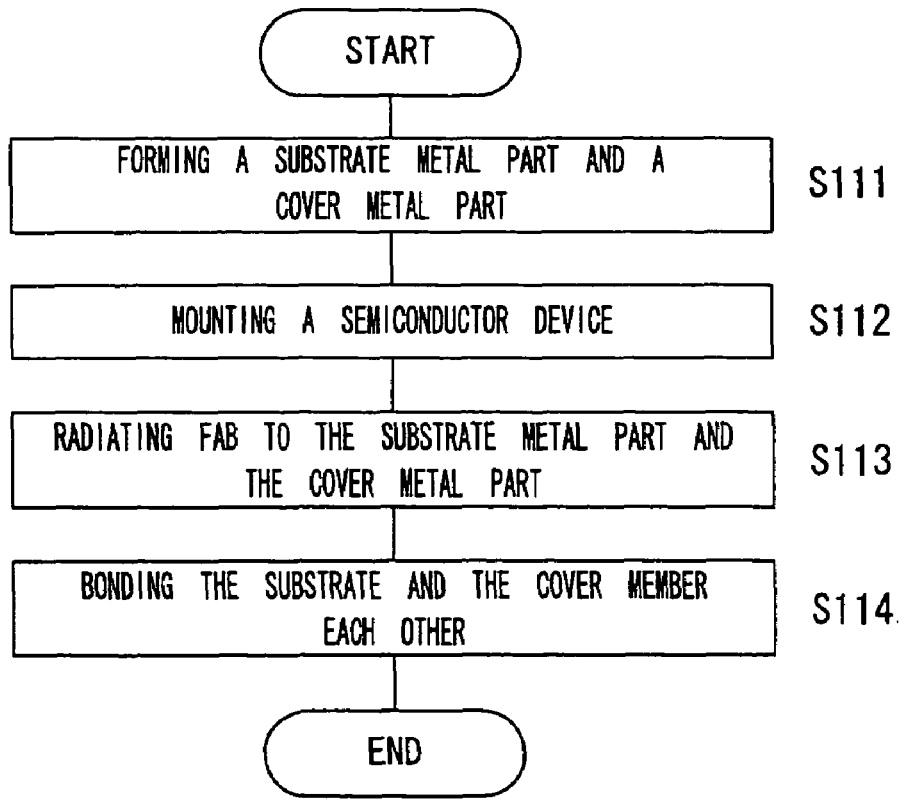
FIG. 4 is a process drawing showing the fabrication steps of a packaged electronic device.

FIG. 4 is a process drawing showing fabrication steps of the packaged electronic device 101. In the fabrication of the packaged electronic device 101, at first gold plating is carried out at respective bonding portions of the substrate 109 and the cover member 102. That is, the gold plating is carried out to an end face 109c of the opening of the cavity 199 of the substrate 109 which is the face opposite to the cover part 102, and a down face 102a of the cover member 102 which is the face in the inner space 190 and thereby forming the substrate metal part 131 and the cover metal part 132 (step S111).

Also, in the step S111, it is preferable to form the substrate metal part 131 and the cover metal part 132 with a width of 5 μm or wider and a height of 5 μm or higher so as to reliably bond the substrate metal part 131 and the cover metal part 132, this will be described in the step S114 below.

Next, the substrate 109, the cover part 102, and the semiconductor device 171 are put into a chamber of a bonding apparatus and the inner pressure of the chamber is reduced by a vacuum bump connected to the chamber. When the inside pressure of the chamber is reduced, preferably to vacuum state, fast atom beam (hereinafter, referred to FAB) of argon (Ar) as a kind of energy wave is radiated to the bump 172 and the electrode on the bottom face of the cavity 199 to clean the surface of the bump 172 and the electrode. That is, material unnecessary on the surface, that is, for example, carbon type pollutant contained in air adhering on and adsorbed in the surface, is removed and the surface is activated. Radiation of FAB removes the surface in the thickness of about 10 nm. After that, the bump 172 is brought into contact with the electrode of the substrate 109, so that the bump 172 and the electrode are bonded by inter-atomic force. The semiconductor device 171 is mounted on the substrate 109 (step S 112). The above-mentioned FAB radiation and successive bonding of the metal portions is so-called surface activation bonding technique.

Mounting of the semiconductor device 171 may be carried out by another technique. For example, in the state that the bump 172 and the electrode of the substrate 109 are connected to each other, the semiconductor device 171 is pushed against the bottom face of the cavity 199 while ultrasonic vibration is applied to bond the bump 172 and the electrode to each other and carry out the mounting. Also, an isotropic conductive resin film or a paste thereof, or a non-conductive resin film or a paste thereof may be used for the mounting. The bump 172 may be formed on the electrode of the substrate 109. A plurality of semiconductor devices 171 may be mounted. Further, another electronic device may be used in place of the semiconductor device 171 as described below.

Next, the FAB is radiated to the substrate metal part 131 of the substrate 109 and the cover metal part 132 of the cover member 102. Thus the surface of the bonding portions of the substrate metal part 131 and the cover metal part 132 are cleaned in about 10 nm thickness as described above and then the above-mentioned pollutant is removed (step S113). In this case, the temperature of the substrate metal part 131 of the substrate 109 and the cover metal part 132 of the cover member 102 is controlled to be at a room temperature or higher and 150° C. or lower and if heating is required, it is carried out by radiating laser beam or the like.

After that, in the condition of the reduced inner pressure or vacuum of the chamber, the substrate metal part 131 and the cover metal part 132 are set so as to oppose each other and are brought into contact with each other, so that the substrate metal part 131 and the cover metal part 132 are bonded so as to form the metal layer 103. As described, the substrate 109 and the cover member 102 are bonded by the metal layer 103 and the inner space 190 in which the semiconductor device 171 is housed is closed in the reduced pressure or vacuum condition, thereby fabricating the packaged electronic device 101 (step S114). Bonding of the substrate 109 and the cover member 102 may be carried out in an inert gas atmosphere. In this case, the inert gas is sealed together with the semiconductor device 171 in the inner space 190. The chamber may be kept in reduced pressure at the time of sealing under inert gas atmosphere. The pressure reduction may be in a range from about atmospheric pressure to 1 Pa (Pascal) to 10 Pa.

As described above, with respect to the packaged electronic device 101, as compared with that in the case of common soldering or glass powder bonding, the substrate 109 and the cover member 102 are bonded at a lower temperature, preferably at a room temperature or higher and 150° C. or lower to close the inner space 190 in which the semiconductor device 171 is housed. As a result, even if the semiconductor device 171 has low heat resistance, it can be housed in the closed space at a low temperature without being damaged by heat. Further, since the substrate 109 and the cover member 102 made of a less heat resistant and more economical resin than a ceramic or a metal can be used, the production cost of the packaged electronic device 101 can be saved. Also, since the inner space 190 is kept in reduced pressure or vacuum or inert gas atmosphere, the semiconductor device 171 can be protected from the effect of moisture or oxygen and deterioration of the properties of the semiconductor device 171 by effects of them can be suppressed.

Since the substrate metal part 131 and the cover metal part 132 are bonded by the strong inter-atomic bonding force in the packaged electronic device 101, the substrate 109 and the cover member 102 can reliably be bonded and the inner space 190 having high air-tightness can be formed. Further, since the substrate metal part 131 and the cover metal part 132 are made of gold, chemically stable, in other words, chemically hardly changeable, metal layer 103 can be formed. Thus the reliability of the closeness of the inner space 190 can be improved.

The second embodiment of the present invention is described as above, however the description is illustrative of the present invention and is not to be construed as limiting the present invention. Various modifications can be made. For example, the substrate 109 and the cover member 102 are preferable to be produced from resins in terms of production cost reduction, however they may be made of other materials such as a metal or a ceramic. Also, as shown in FIG. 5, the cover member 102 may be a substrate on which the SAW filter 105 or the like is formed or a quartz substrate. Further, the packaged electronic device 101 is electrically connected with an electrode 108a of another substrate 108 by a via 106 formed in the substrate 109 and the outer electrode 107 electrically connected with the via 106. Also, although the metal layer 103 is preferable to be formed from gold in terms of reliability improvement of the closeness of the inner space 190 and oxidation resistance, other various metals may be used for forming the layer.

The substrate 109 and the cover member 102 may be a flat plate-like board and a cover member having a recessed part for covering the side of the semiconductor device 171 mounted on the substrate and the upper part on the opposite to the substrate 109, respectively. Also, they may be a substrate and a cover member each having a cavity structure, respectively, and form an inner space 190 by being bonded each other so as to close their openings.

At the time of bonding of the substrate 109 and the cover member 102, the temperature of the substrate metal part 131 and the cover metal part 132 is preferable to be in a range described above in the second embodiment from a viewpoint of suppression of the heat to the semiconductor device 171 mounted on the substrate 109. However it is not limited to the above range, and in the case the semiconductor device 171 having relatively high heat resistance is mounted on the substrate 109, the temperature may be higher than the above-mentioned range.

In the above-mentioned second embodiment and the third and following respective embodiments, argon is used for the FAB and other atoms such as nitrogen, hydrogen or the like can be used as the FAB. Further, the substrate metal part 131 and cover metal part 132 may be cleaned by other energy wave such as an ion beam or the like in place of the FAB. For example, an energy wave of relatively short wavelength, for example excimer ultraviolet rays having wavelength of 172 nm. Also although it is slightly less effective on the cleaning, light rays having wavelength of 250 nm or 365 nm emitted by a low pressure mercury lamp can also be used. Further, if the above excimer ultraviolet rays are employed, it is possible to carry out the cleaning treatment in atmospheric air but not in reduced pressure or vacuum. In the case of treatment in atmospheric air, further, decomposition of the impurities adhering to a metal part can be promoted by heating at least an object metal portion to be cleaned at a room temperature or higher and 150° C. or lower, and accordingly the hardness of the metal portion can be lowered to make the bonding easy. In the case the above-mentioned cleaning treatment is carried out in reduced pressure or vacuum, the above heating may not be carried out.

Further, as shown in FIG. 6, a plurality of packaged electronic devices 101 shown in FIG. 3 are fabricated in series and cut at cutting parts 104 after fabrication to fabricate respective packaged electronic devices 101.

As described, the manufacturing method of the packaged electronic device 101 is applicable for sealing various kinds of electronic devices other than semiconductor devices, particularly for electronic devices with low heat resistance and low humidity.

Third Embodiment

Figure 7:
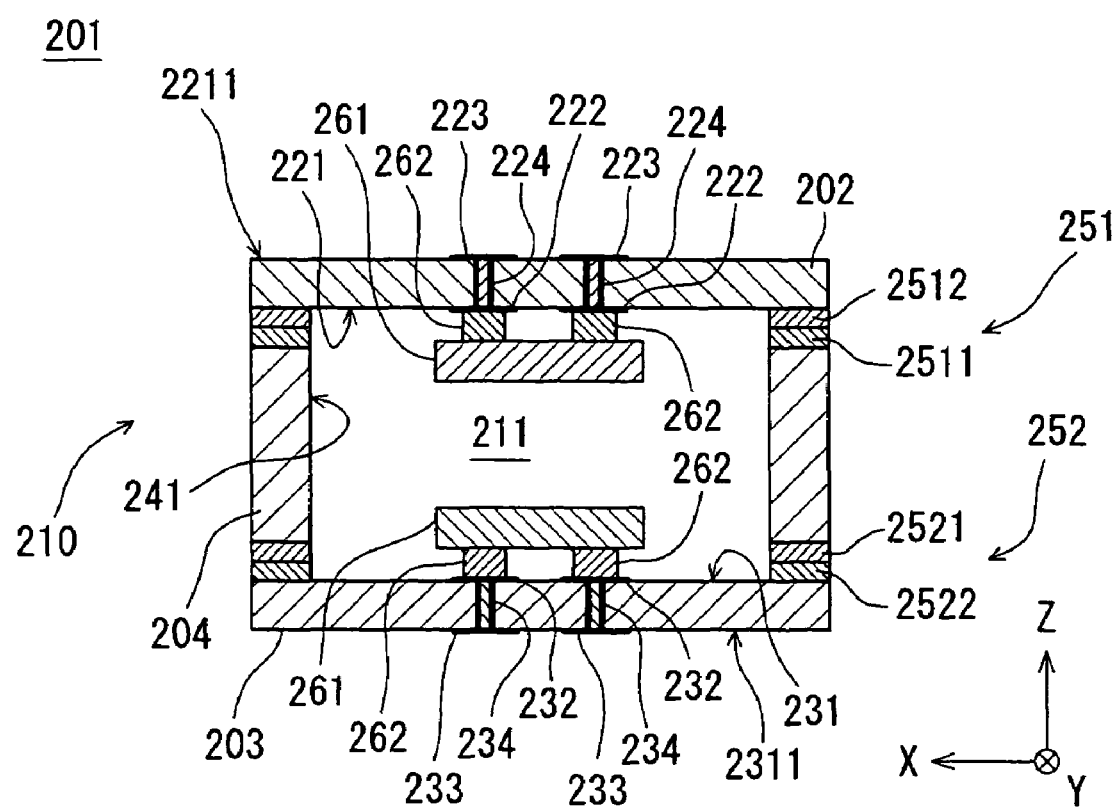
FIG. 7 is a cross-sectional view showing the structure of a packaged electronic device according to the third embodiment.

FIG. 7 is a cross-sectional view showing the structure of a packaged electronic device 201 according to the third embodiment of the present invention. The packaged electronic device 201 is a package in whose inside a semiconductor device 261 as an electronic device is sealed, that is electronic devices installed in a closed space 211 and packaged, and comprises two semiconductor devices 261 and a container 210 forming an inner space 211 for housing these two semiconductor devices 261.

Figure 8:
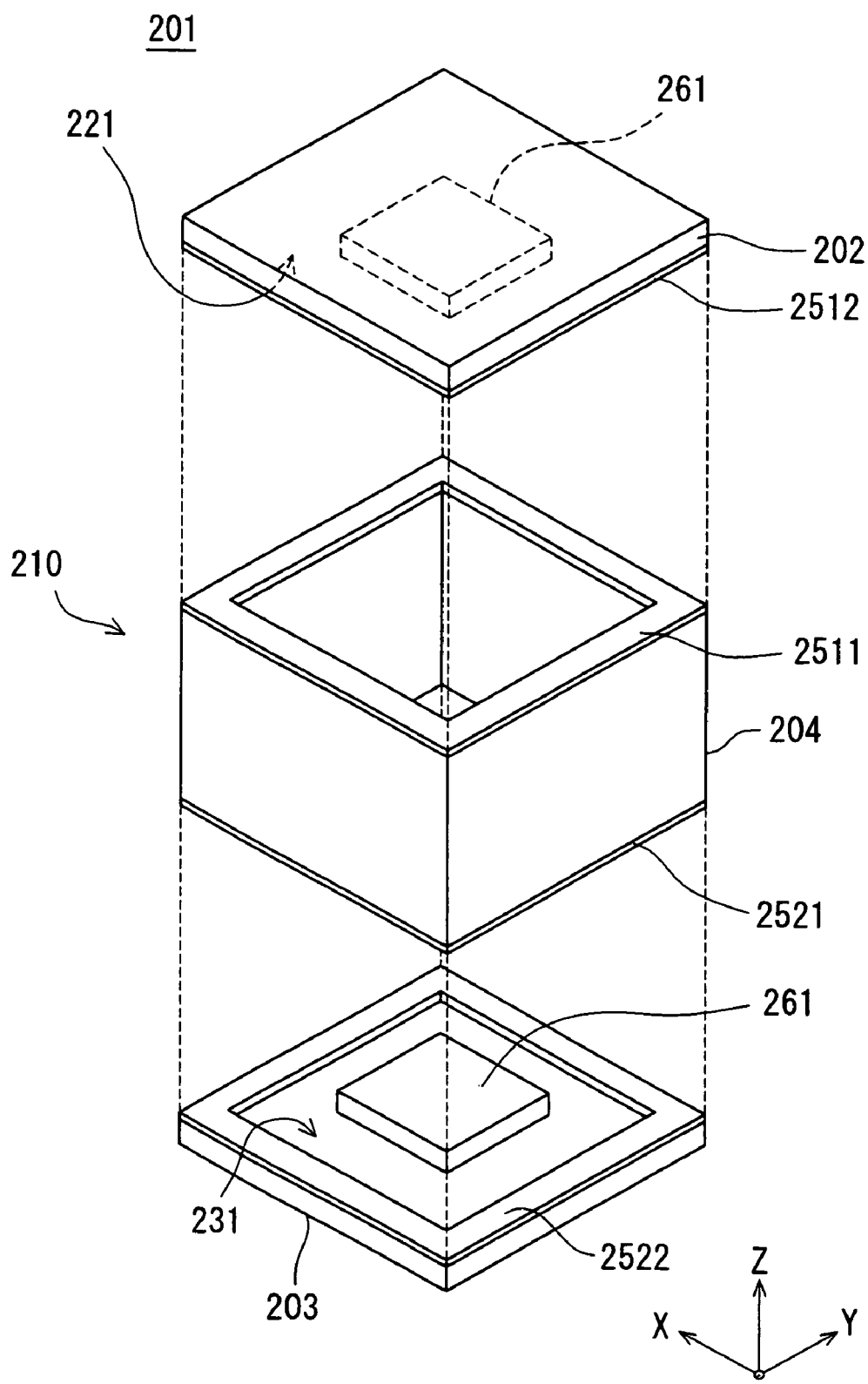
FIG. 8 is an exploded perspective view showing a packaged electronic device.

FIG. 8 is an exploded perspective view showing the packaged electronic device 201. The container 210 comprises a cylindrical member 204 having apertures in both ends in the z-direction, an upper cover member 202 for covering an aperture in one end side (+Z) side in the axial direction of the cylindrical member 204 and a lower cover member 203 for covering an aperture in the other end side (−Z) side of the cylindrical member 204. The upper cover member 202 corresponds to a first cover member and the lower cover member 203 corresponds to a second cover member and the lower cover member 203 and the cylindrical member 204 are corresponding to a main body member. The upper cover member 202, the lower cover member 203, and the cylindrical member 204 are made of a resin. Metal parts 2511 and 2521 made of gold (Au) are formed respectively in the end faces of the (+Z) side and the (−Z) side of the cylindrical member 204. The metal parts 2511 and 2521 are corresponding to a second metal member. Further, metal parts 2512 and 2522 made of gold (Au) are formed respectively in regions, to which the cylindrical member 204 is to be attached, in a face 221 corresponding to a first inner face and a first mounting face; that is, the face in the (−Z) side of the upper cover member 202 [the face forming the upper side face of the inner space 211 (hereinafter referred to as an "upper face")] and in a face 231 corresponding to a second inner face and a second mounting face; that is, the face in the (+Z) side of the lower cover member 203 [the face forming the lower side face of the inner space 211 (hereinafter referred to as an "lower face")]. The metal parts 2512 and 2522 are corresponding to a first metal part. A semiconductor device 261 is mounted each in the upper face 221 and the lower face 231 of the inner space 211. The semiconductor device 261 mounted on the upper face 221 corresponds to a first electronic device and the semiconductor device 261 mounted on the lower face 231 corresponds to a second electronic device.

As shown in FIG. 7, in the packaged electronic device 201, the metal parts 2521 and 2522 are bonded to form a metal layer 252, so that the cylindrical member 204 and the lower cover member 203 are bonded and the metal parts 2511 and 2512 are bonded to form a metal layer 251, so that the cylindrical member 204 and the upper cover member 202 are bonded. The upper cover member 202 and the lower cover member 203 are attached to both ends of the cylindrical member 204 while closing the apertures as described above, so that the inner space 211 is formed by the upper cover member 202, the lower cover member 203, and the face facing to the inside of the cylindrical member 204 and an inner face 241 of the cylindrical member 204 forms the side face of the inner space 211. Hereinafter, the face 241 is called as a "side face".

The upper cover member 202 is a multilayer board comprising an inner electrode 222 formed on the upper face 221 of the inner space 211 and an outer electrode 223 formed on the face in the (+Z) side, that is a face 2211 on the opposite side of the upper cover member 202 as the upper face 221, which is the outer surface of the container 210. The inner electrode 222 and the outer electrode 223 are electrically connected by a via 224 penetrating the upper cover member 202. The semiconductor device 261 to be mounted on the upper face 221 is connected electrically to the inner electrode 222 through the outer part electrode 223 and the via 224.

The lower cover member 203 is a multilayer board comprising an inner electrode 232 formed on the lower face 231 and an outer electrode 233 formed on the face in the (−Z) side, that is a face 2311 on the opposite side of the lower cover member 203 as the lower face 231, which is the outer surface of the container 210. The inner electrode 232 and the outer electrode 233 are electrically connected by a via 234 penetrating the lower cover member 203. The semiconductor device 261 to be mounted on the lower face 231 is connected electrically to the outer electrode 233 through the inner part electrode 232 and the via 234.

The semiconductor device 261 is so-called a bare IC chip and is mounted on the upper cover member 202 or the lower cover member 203 by electrically bonding a metal bump 262 formed on a land on the mounting face of the semiconductor device 261 to the inner electrode 222 of the upper cover member 202 or the inner electrode 232 of the lower cover member 203.

Figure 9:
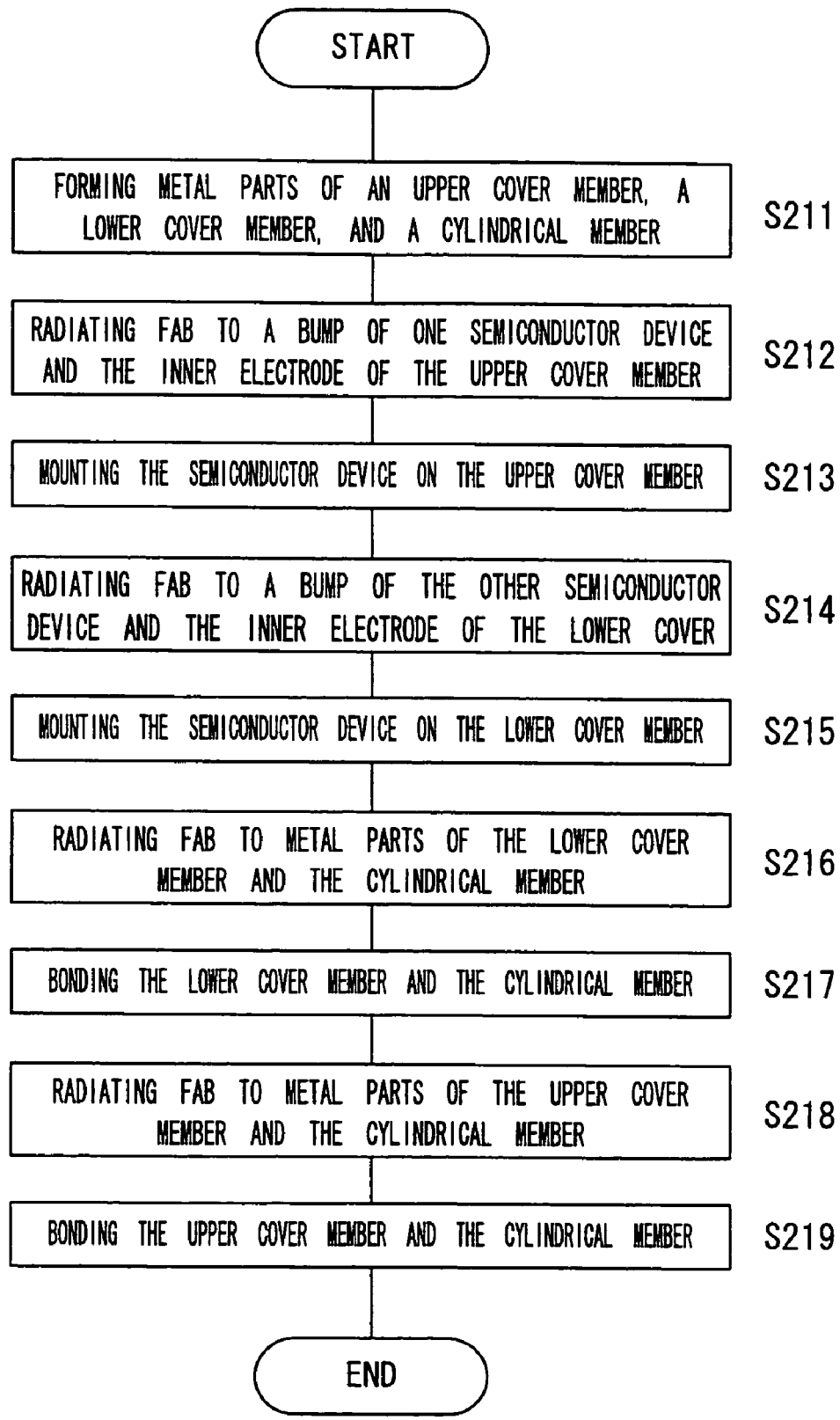
FIG. 9 is a process drawing showing fabrication steps of a packaged electronic device.

FIG. 9 is a drawing showing the production process of the packaged electronic device 201. In a production of the packaged electronic device 201, gold plating is formed on bonding portions of the respective upper cover member 202, lower cover member 203, and cylindrical member 204 to form metal parts 2512, 2522, 2511, and 2521 (step S211).

In the step S211, it is preferable to form the metal parts 2522, 2521, 2512, and 2511 with a width of 5 μm or wider and a height of 5 μm or higher so as to reliably bond the metal part 2522 to the metal part 2521 and the metal part 2512 to the metal part 2511.

Successively, the upper cover member 202, the lower cover member 203, the cylindrical member 204, and two semiconductor devices 261 are transported into a load lock of a bonding apparatus, and after the inner pressure of the load lock is reduced by a vacuum pump connected to the load lock, they are transported to a chamber previously kept in a reduced pressure or preferably vacuum state and arranged at prescribed positions. Next, under the reduced pressure or vacuum environment in the chamber, fast atom beam (hereinafter, referred to "FAB") of argon (Ar) is radiated to the bump 262 of one semiconductor device 261 and the inner electrode 222 of the upper cover member 202 to clean the surface of the bump 262 and the inner electrode 222. That is, the substances unnecessary on the surfaces, that is, carbon type pollutants contained in air adhering to and adsorbed in the surfaces, are removed and the surfaces are activated (step S212). Radiation of the FAB removes the surfaces in the thickness of about 10 nm. The temperature of the bump 262 and the inner electrode 222 is preferably a room temperature or higher and 150° C. or lower in terms of the promotion of the surface activation and prevention of the damages of the semiconductor device 261 by high temperature heating, and based on necessity, heating may be carried out by radiating laser beam or the like. After that, the semiconductor device 261 is mounted on the upper cover member 202 (step S213) by contact metal bonding such that the bump 262 and the inner electrode 222 are bonded to each other.

With respect to the other semiconductor device 261, in the reduced pressure or vacuum environment, the FAB is radiated to the bump 262 of the semiconductor device 261 (step S214) and the inner electrode 232 of the lower cover member 203 and the bump 262 and the inner electrode 232 are mutually bonded by the contact metal bonding to mount the semiconductor device on the lower cover member 203 (step S215). Bumps in place of the bump 262 may be formed previously in the inner electrode 222 and the inner electrode 232, respectively. In this case, the land of the semiconductor device 261 and the bump are bonded each other after cleaning by the FAB. Further, mounting of the semiconductor device 261 on the upper cover member 202 is carried out after the mounting on the lower cover member 203.

When the semiconductor devices 261 are mounted on the upper cover member 202 and the lower cover member 203, respectively, the FAB is radiated to the metal part 2522 of the lower cover member 203 and to the metal part 2521 in the (−Z) side of the cylindrical member 204 in reduced pressure or vacuum environment in the chamber to clean the surfaces of both metal parts in the depth of about 10 nm as described above (step S216). In this case, both metal parts are heated at a temperature in a range from a room temperature or higher to 150° C. or lower by radiating laser beam or the like based on the necessity. Successively, the metal part 2522 and the metal part 2521 are brought into contact with each other and bonded each other by the metal bonding to form the metal layer 252 and thus the lower cover member 203 and the cylindrical member 204 are bonded (step S217).

Next, in the reduced pressure or vacuum environment, the FAB is radiated to the metal part 2512 of the upper cover member 202 and the metal part 2511 in the (+Z) side of the cylindrical member 204 to clean the surfaces of both metal parts as described above (step S218). In this case, both metal parts are heated at a temperature in a range from a room temperature or higher to 150° C. or lower by the radiating laser beam or the like based on the necessity. After that, the metal part 2512 and the metal part 2511 are brought into contact with each other and bonded each other by metal bonding to form the metal layer 251. The cylindrical member 204 whose aperture in the (−Z) side is closed by the lower cover member 203 and the upper cover member 202 are bonded by the metal layer 251 and thus the inner space 211 housing those two semiconductor devices 261 is closed in the reduced pressure or vacuum state (step S219).

As described the lower cover member 203, the upper cover member 202, and the cylindrical member 204 are bonded while those two mounted semiconductor devices 261 are set in the inside, that is, they are facing to the inner space 211 and accordingly, the container 210 is formed and the packaged electronic device 201 is fabricated. Mounting of the semiconductor devices 261 and bonding of the respective metal parts may be carried out in inert gas atmosphere. In this case, the inert gas is enclosed in the inner space 211 in which the semiconductor devices 261 are sealed. Further, at the time of sealing in the inert gas atmosphere, the inside pressure of the chamber may be reduced. The pressure reduction may be in a range from atmospheric pressure to 1 Pa (Pascal) to 10 Pa.

In the packaged electronic device 201, since the semiconductor device 261 mounted on the upper face 221 and the semiconductor device 261 mounted on the lower face 231 are electrically connected with the outer electrode 223 and the outer electrode 233, respectively, if the packaged electronic device 201 is mounted on an outer board, the outer board and the two semiconductor devices 261 are electrically connected. Mounting of the packaged electronic device 201 on the outer board may be carried out by connecting the outer electrode 233 with an electrode of the outer board by an anisotropic conductive resin film and connecting the outer electrode 223 with an electrode of the outer board by wire bonding. Thus a plurality of packaged electronic devices 201 can be arranged at a high density on the outer board.

As described above, with respect to the packaged electronic device 201, since two semiconductor devices 261 are directly mounted on the upper cover member 202 and the lower cover member 203, which are the multilayer boards having the outer electrodes, the package is made suitable for highly densified arrangement of micro-electronic devices. Further, since the apertures in both ends of the cylindrical member 204 are closed by the upper cover member 202 and the lower cover member 203 on which the semiconductor devices 261 are mounted in order to form the container 210, the two semiconductor devices 261 are mounted on two opposed faces of the inner space 211, that is, the upper face 221 and the lower face 231 and thus the packaged electronic device 201 can easily be fabricated.

With respect to the packaged electronic device 201, as compared with that in the case of welding, that is, common soldering or glass powder bonding, the cylindrical member 204 is bonded to the upper cover member 202 and to the lower cover member 203 at a lower temperature, preferably at a room temperature or higher and 150° C. or lower, so that the inner space 211 in which the semiconductor devices 261 are housed is closed. As a result, even if the semiconductor devices 261 have low heat resistance, they can be housed in the inner space 211 at a low temperature without being damaged by heat. Further, since the upper cover member 202, the lower cover member 203, and the cylindrical member 204 made of a less heat resistant and more economical resin than a ceramic or a metal can be used, the production cost of the packaged electronic device 201 can be saved.

With respect to the packaged electronic device 201, since the respective metal parts 2512, 2511, 2521, and 2522 are bonded by strong inter-atomic bonding power, the adhesion of the respective members 202, 204, and 203 is increased and the inner space 211 with high closeness can be formed. Further, since the metal layers 251 and 252 are of gold that is chemically stable, that is, hardly causes chemical conversion, the reliability of the closeness of the inner space 211 is improved.

Further, since the inner space 211 is kept in reduced pressure or vacuum state or an inert gas atmosphere, the semiconductor devices 261 are protected from the effects of moisture and oxygen existing in the atmospheric air and property deterioration of the semiconductor devices 261 due to these effects can be suppressed. In such a manner, the packaged electronic device 201 is suitable for sealing semiconductor devices 261 with low heat resistance and low moisture resistance.

Fourth Embodiment

Figure 10:
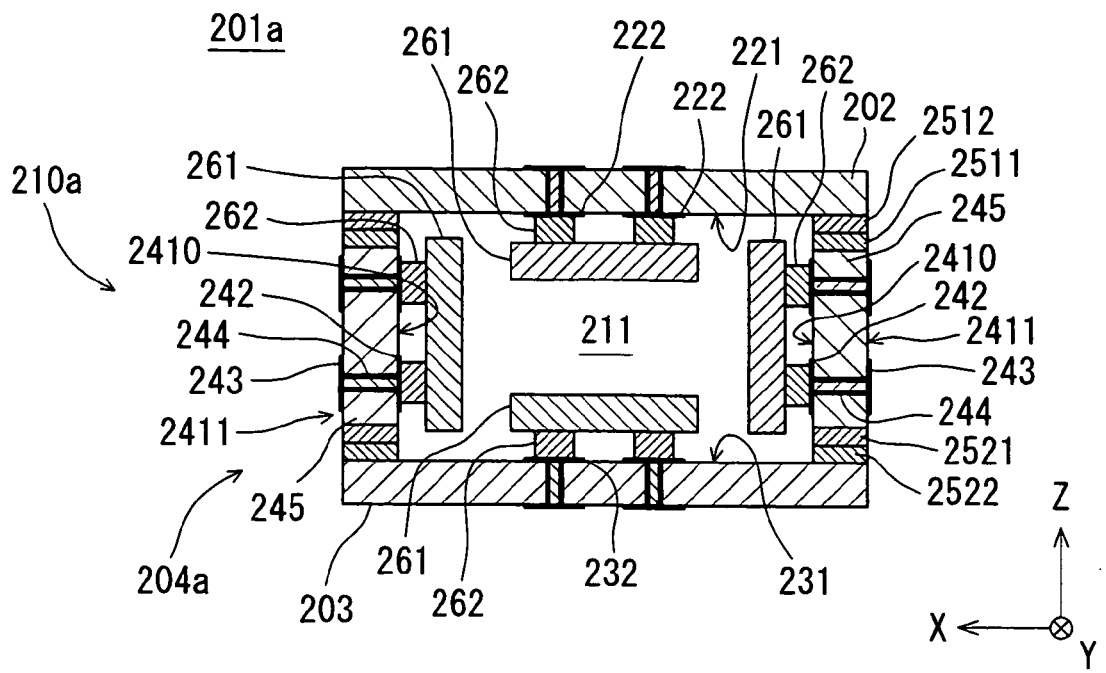
FIG. 10 is a cross-sectional view showing the structure of a packaged electronic device according to the fourth embodiment of the present invention.
Figure 11:
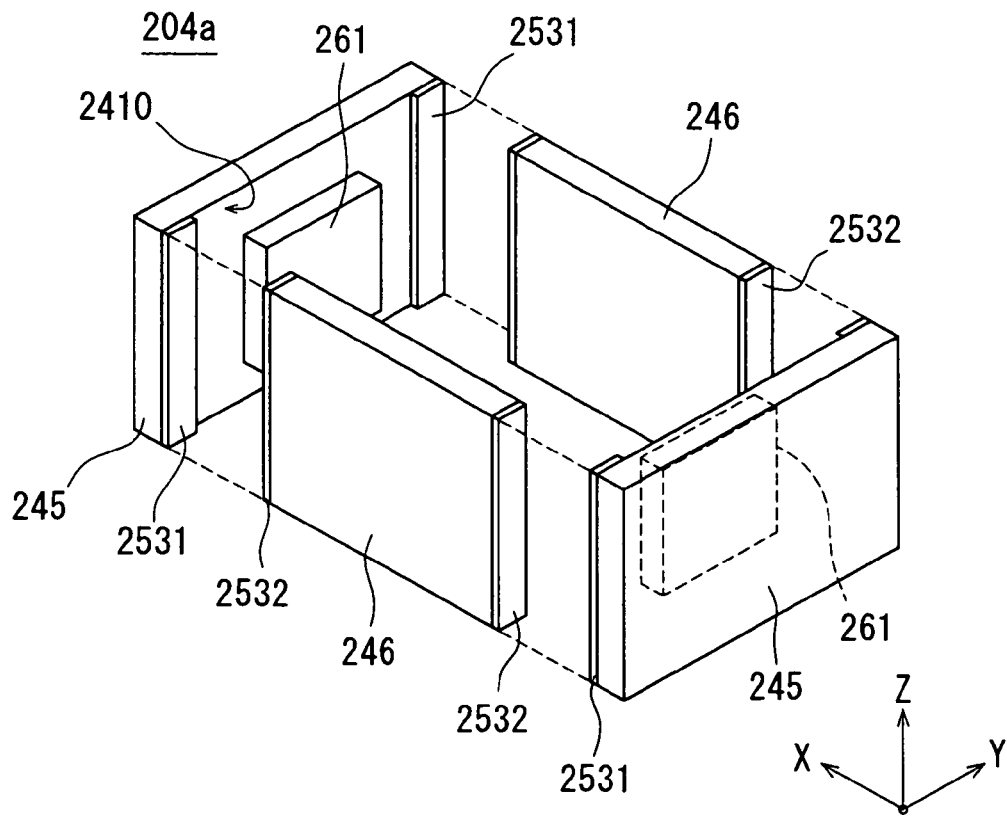
FIG. 11 is an exploded perspective view showing a cylindrical member and a semiconductor device to be mounted in the cylindrical member.

FIG. 10 is a cross-sectional view showing a structure of a packaged electronic device 201a according to the fourth embodiment of the present invention. As shown in FIG. 11, the packaged electronic device 201a has a cylindrical member 204a made of a resin in which two semiconductor devices 261 are installed in place of the cylindrical member 204 of the packaged electronic device 201 shown in FIG. 7. A structure other than that is the same as that of shown in FIG. 7 and in the description below, the same symbols are assigned. As shown in FIG. 10, with respect to the packaged electronic device 201a, four semiconductor devices 261 in total are mounted one each on the upper face 221, the lower face 231, and two opposed side faces in the x-direction (hereinafter, referred to as "mounting side faces") of the inner space 211.

FIG. 11 is an exploded perspective view showing the cylindrical member 204a and semiconductor devices 261 mounted on the cylindrical member 204a. The cylindrical member 204a comprises two side wall members 245 on which the semiconductor devices 261 are mounted one each, and two connection members 246 for connecting two side wall members 245. Metal parts 2531 of gold (Au) are formed at the portions where the connection members 246 are to be connected in the mounting side faces 2410 of the side wall members 245. Metal parts 2532 of gold (Au) are formed similarly in both end faces in the x-direction, which are the bonding portions of the connection members 246. The metal parts 2531 and metal parts 2532 are bonded to each other by metal-bonding, so that the cylindrical member 204a is formed by bonding the side wall members 245 and the connection members 246 to each other.

Each of the side wall members 245 is a flat multilayer board made of a resin and as shown in FIG. 10, and comprises an inner electrode 242 formed on the mounting side face 2410 and an outer electrode 243 formed on an outside face 2411 of the mounting side face 2410. The inner electrode 242 and the outer electrode 243 are electrically connected by a via 244 penetrating the side wall member 245. In the cylindrical member 204a, the semiconductor devices 261 are mounted in the side wall members 245, so that they are electrically connected with the outside electrodes 243.

Figure 12:
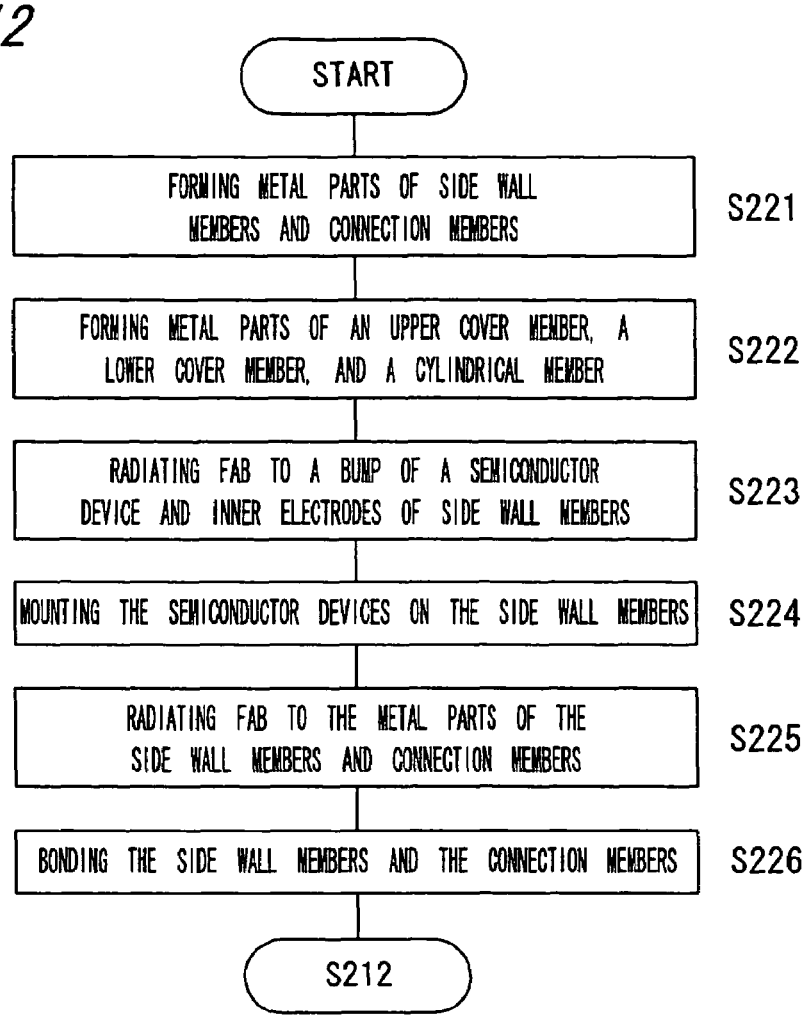
FIG. 12 is a process drawing showing fabrication steps of a packaged electronic device.

FIG. 12 is a drawing showing some of fabrication steps of the packaged electronic device 201a. In fabrication of the packaged electronic device 201a, prior to the steps S212 to S219 shown in FIG. 9, the steps shown in FIG. 12 are carried out. At first, gold plating is carried out for the respective connection portions of the side wall members 245 and the connection members 246 shown in FIG. 11, thereby forming the metal parts 2531 and 2532 (step S221).

Successively, gold plating is carried out for the respective connection portions of the upper cover member 202 and the lower cover member 203 shown in FIG. 10, thereby forming the metal parts 2512 and 2522. Further, gold plating is carried out for the portions which correspond to the bonding portions of the cylindrical member 204a when the cylindrical member 204a is formed by bonding each member among the end faces in the Z-direction of the side wall members 245 and the connection members 246 composing the cylindrical member 204a. Thus the metal parts 2511 and 2521, precisely, metals parts to form the ring-like metal parts 2511 and 2521 when the cylindrical member 204a is formed are formed (step S222).

On completion of formation of the above-mentioned respective metal parts, the upper cover member 202, the lower cover member 203, the side wall members 245, connection members 246, and four semiconductor devices 261 are arranged in a chamber previously kept in a reduced pressure or preferably vacuum state via a load lock of a bonding apparatus. The FAB is radiated to the bumps 262 of two semiconductor devices 261 and the inner electrodes 242 of two side wall members 245 to clean the surfaces thereof (step S223). After that, a single semiconductor device 261 is mounted on the respective mounting side faces 2410 of two side wall members 245 by the metal bonding which makes the bumps 262 and the inner electrodes 242 contact (step S224).

Successively, in a reduced pressure or preferably vacuum state of the chamber, the FAB of argon is radiated to the metal parts 2531 and 2532 of the side wall members 245 to clean the surfaces of both metal parts (step S225). In this case, both metal parts 2531 and 2532 are heated at a temperature in a range from a room temperature or higher to 150° C. or lower by radiating laser beam or the like based on the necessity. Next, the work of metal bonding of both metal parts by bringing the metal parts 2531 and the metal parts 2532 into contact with each other is repeated to successively bond the two side wall members 245 and the two connection members 246, and thus the cylindrical member 204a is formed (step S226).

After that, the FAB is radiated to the bump 262 of one semiconductor device 261 in two un-mounted semiconductor devices 261 and to the inner electrode 222 of the upper cover member 202 (FIG. 9: step S212), and the bump 262 and the inner electrode 222 are metal-bonded to mount the semiconductor device 261 on the upper cover member 202 (step S213). Similarly, the FAB is radiated to the bump 262 of the other semiconductor device 261 and the inner electrode 232 of the lower cover member 203 (step S214), and the bump 262 and the inner electrode 232 are metal-bonded to mount the semiconductor device 261 on the lower cover member 203 (step S215).

Successively, the FAB is radiated to the metal part 2522 of the lower cover member 203 and the metal part 2521 of the cylindrical member 204a (step S216), and both metal parts 2522 and 2521 are metal-bonded to bond the lower cover member 203 and the cylindrical member 204a (step S217). Also, the FAB is radiated to the metal part 2512 of the upper cover member 202 and the metal part 2511 of the cylindrical member 204a (step S218) and both metal parts 2512 and 2511 are metal-bonded to bond the upper cover member 202 and the cylindrical member 204a. Thus the inner space 211 housing the four semiconductor devices 261 is closed in the reduced pressure or vacuum state (step S219). As described, the lower cover member 203, the upper cover member 202, and two side wall members 245 are bonded one another or bonded with the connection parts 246 while the mounted semiconductor devices 261 are set inside, that is, the in the inner space 211 side. In this manner the container 210a is formed and the packaged electronic device 201a housing the four semiconductor devices 261 is fabricated.

Mounting of the semiconductor devices 261 on the lower cover member 203 and the upper cover member 202 may be carried out prior to bonding of the side wall members 245 and the connection members 246. The mounting order on the respective members may properly be changed. Also, bonding of the upper cover member 202 and the lower cover member 203 with the cylindrical member 204a may be carried out in the inert gas atmosphere, and in this case, the inert gas is enclosed in the inner space 211. Further, at the time of sealing in the inert gas atmosphere, the inside pressure of the chamber may be reduced. The pressure reduction may be in a range from atmospheric pressure to 1 Pa (Pascal) to about 10 Pa.

As described above, with respect to the packaged electronic device 201a, the four semiconductor devices 261 are directly mounded on the upper face 221, the lower face 231, and side faces 241, that is, the mounting side faces 2410 of the side wall members 245, of the inner space 211 formed by combining the multilayer boards each having outer electrodes, so that the structure of the package can be made suitable for highly densified arrangement of micro-electronic devices. Further, since the container 210a is formed by bonding the respective members after the semiconductor devices 261 are mounted on the flat members, which are the upper cover member 202, the lower cover member 203, and the side wall members 245, so that the semiconductor devices 261 can be installed within the container 210a and the packaged electronic device 201a can easily be fabricated.

With respect to the packaged electronic device 201a, similarly to the packaged electronic device 201, even if the semiconductor devices 261 have low heat resistance, they can be housed in the inner space 211 at a low temperature without being damaged by heat. Thus since a less heat resistant and more economical resin is made usable, the production cost of the packaged electronic device 201a can be saved.

Further, the inner space 211 is kept in the reduced pressure or vacuum state, so that the semiconductor devices 261 can be protected from the effect of moisture and oxygen existing in the atmospheric air. Also, since the respective members composing the container 210a are bonded by atomic bonding of the respective metal parts made of gold, not only the inner space 211 with high closeness can be formed but also the closeness of the inner space 211 can be improved.

Fifth Embodiment

Figure 13:
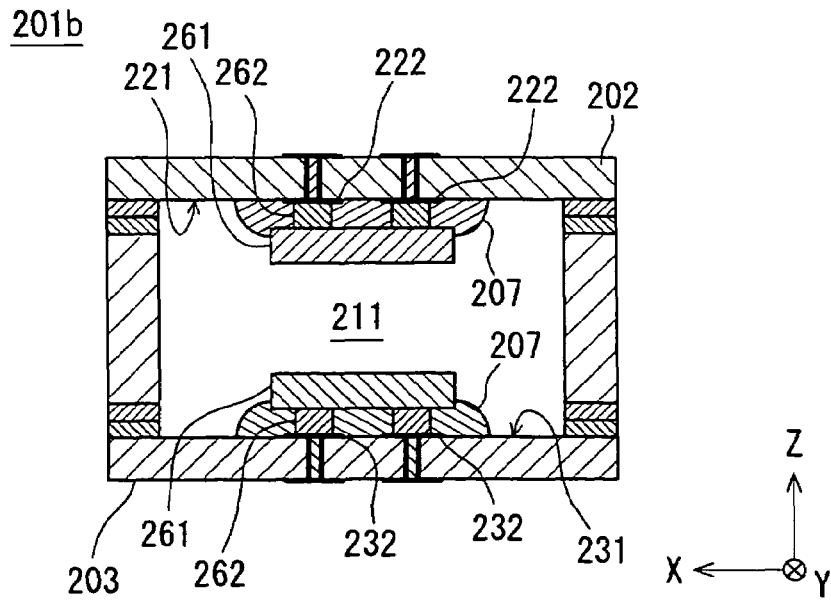
FIG. 13 is a cross-sectional view showing the structure of a packaged electronic device according to the fifth embodiment.

FIG. 13 is a cross-sectional view showing the structure of a packaged electronic device 201b. The packaged electronic device 201b is similar to the packaged electronic device 201 shown in FIG. 7, except a mounting method of the semiconductor devices 261 is different and in the following description; the same reference numerals are assigned.

In the packaged electronic device 201b shown in FIG. 13, the two semiconductor devices 261 are mounted respectively on the upper face 221 and the lower face 231 of the inner space 211 through a resin 207 having thermosetting property applied on these faces.

Figure 14:
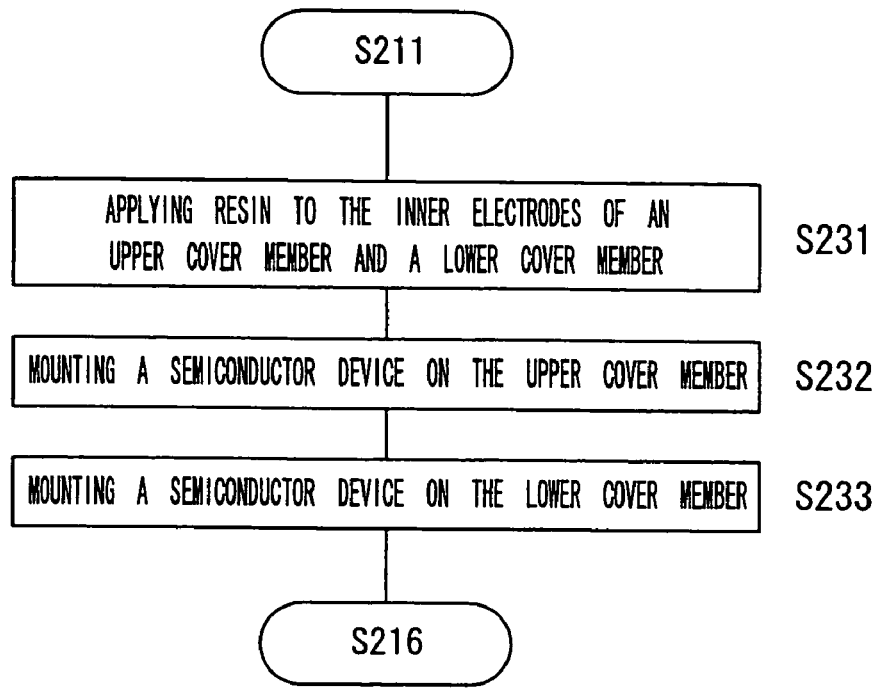
FIG. 14 is a mounting process drawing of a semiconductor device.

FIG. 14 is a mounting process drawing of the semiconductor devices 261 in the fabrication process of the packaged electronic device 201b and corresponding to the steps S212 to S215 in FIG. 9. In the packaged electronic device 201b shown in FIG. 13, the resin 207 is applied on the inner electrode 222 of the upper cover member 202 and the inner cover electrode 232 of the lower cover member 203 (step S231). The resin 207 is an anisotropic conductive resin film (ACF) made of an insulating resin in which conductive particles are evenly dispersed. One semiconductor device 261 is fixed on the upper cover member 202 by pressing the semiconductor device 261 to the resin 207 applied to the upper cover member 202 and heating them. The bump 262 is electrically bonded to the inner electrode 222 though the conductive particles of the resin 207, so that the semiconductor device 261 can be mounted on the upper cover member 202 (step S232). Similarly, with respect to the other semiconductor device 261, the bump 262 is connected with the inner electrode 232 by pressing the semiconductor device 261 to the resin 207 applied to the lower cover member 203 and heating them. The bump 262 is electrically bonded to the inner electrode 232 and the semiconductor device 261 is mounted on the lower cover member 203 (step S233). In this case, mounting of the semiconductor devices 261 is not necessarily carried out in the chamber.

The resin 207 to be used may be an anisotropic conductive paste (ACP), or a non-conductive resin film (NCF), or a non-conductive resin paste (NCP) and these resins may have curable property by treatment other than the heating treatment. In any case, since the semiconductor devices 261 can directly be mounted on the upper cover member 202 and the lower cover member 203, which are multilayer boards respectively having outer electrodes, the packaged electronic device 201b is provided with a structure suitable for high density arrangement of very small electronic devices.

Sixth Embodiment

Figure 15:
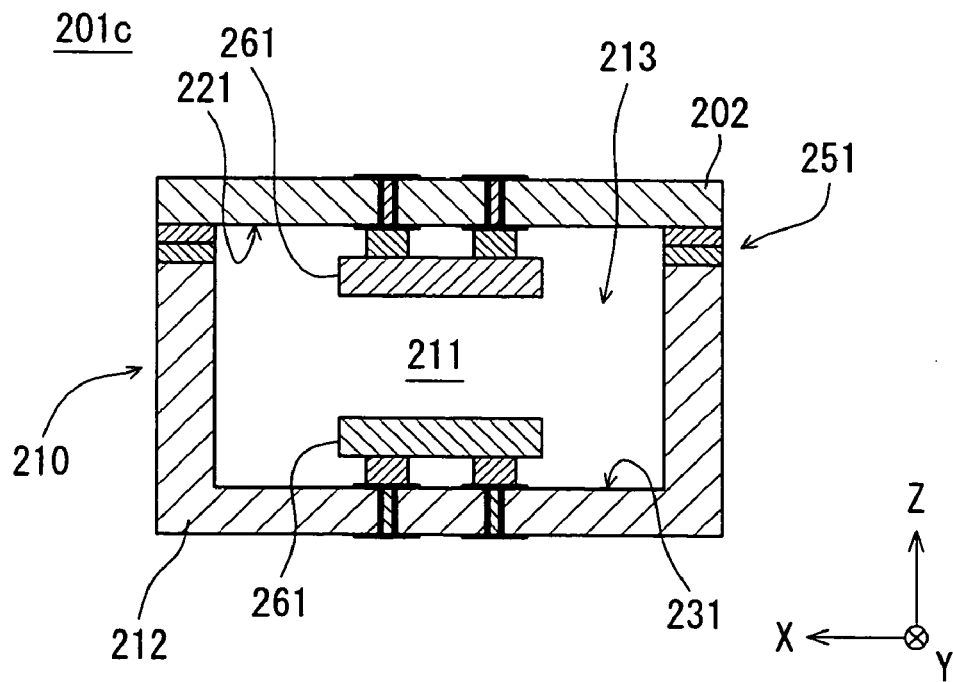
FIG. 15 is a cross-sectional view showing the structure of a packaged electronic device according to the sixth embodiment.

FIG. 15 is a cross-sectional view showing the structure of a packaged electronic device 201c of the sixth embodiment of the present invention. The packaged electronic device 201c comprises a member 212 (hereinafter, referred to "cavity substrate") having a cavity (a recessed part) 213 in place of the cylindrical member 204, the lower cover member 203, and the metal layer 252 bonding both members of the packaged electronic device 201 shown in FIG. 7. The cavity substrate 212 is corresponding to a main body member. Other structures are same as that in FIG. 7 and in the following description, the same reference numerals are assigned. In the packaged electronic device 201c, the cavity substrate 212 and the upper cover member 202 are bonded to form the container 210c.

The cavity substrate 212 can be formed by layering ceramic layers to be side walls on a flat ceramic substrate forming the bottom part. Generally, a plurality of cavities are formed in a lattice-like form on one ceramic substrate and the cavity substrates 212 are formed by cutting the resulting substrate.

The bottom part and side walls of the cavity substrate 212 work respectively as the lower cover member 203 and the cylindrical member 204 shown in FIG. 7 and a semiconductor device 261 is mounted on the bottom face of the cavity 213, that is the face in the (+Z) side of the bottom part of the cavity substrate 212, in other words, a bottom face 231 of an inner space 211. The packaged electronic device 201c is fabricated by bonding the upper cover member 202 and the cavity substrate 212 through the metal layer 251 in the same manner of the third embodiment (step S218, S219 of FIG. 9) in the state that the other semiconductor device 261 is mounted on the face closing the opening of the cavity 213, which is the face to be the upper face 221 of the inner space 211, in other words, the face in (−Z) side of the upper cover member 202 and thus closing the inner space 211. Therefore, fabrication of the packaged electronic device 201c is made easy. Mounting of the semiconductor device 261 may be made by metal bonding similarly to the third embodiment or through a resin similarly to the fifth embodiment.

In the packaged electronic device 201c of the sixth embodiment, as described with reference to FIG. 6, each packaged electronic device 201c may be fabricated by fabricating a plurality of packaged electronic devices 201c in single-piece construction and then cutting at cutting parts.

The third to sixth embodiments of the present invention are described above, however the description is illustrative of the present invention and is not to be construed as limiting the present invention. Various modifications can be made. For example, although it is preferable to use a resin for forming the upper cover member 202, the lower cover member 203, and the cylindrical member 204 in terms of production cost reduction, they may be made of a metal, a ceramic, or another material. The metal parts for bonding the respective members composing the container 210 are preferably made of gold in terms of improvement of the closeness of the inner space 211 and the oxidation resistance in air, however they may be made of other various metals.

In the above-mentioned embodiments, although argon is used as the FAB, other atoms such as nitrogen, hydrogen or the like may be used for the FAB. Further, the metal parts and electrodes may be cleaned by other kinds of energy wave such as ion bean, etc. in place of the FAB.

The containers 210, 210a, and 210c are not necessarily formed by bonding the members with the shapes described in the above-mentioned respective embodiments but may be formed bonding members having various shapes. For example, two substrates having respective cavity structure are bonded in a manner that apertures of the cavities are closed to form the inner space 211. Further, bonding of the members may be carried out using an adhesive containing a resin as a main component.

Mounting of a semiconductor device 261 may be carried out by means other than those described above. For example, in the state that a bump 262 and an inner electrode 222 are brought into contact with each other and a semiconductor device 261 is pressed, ultrasonic vibration is applied to bond the bump 262 and the inner electrode 222 and thus the semiconductor device 261 is mounted. Further, the faces of the containers 210, 210a, and 210c on which a plurality of semiconductor devices 261 are mounted are not limited to the combinations described in the above-mentioned embodiments and may be changed properly. That is, electronic devices may be mounted on at least one face and another face among the upper face 221, the lower face 231, and four side faces 241 of the inner space 211, so that highly dense arrangement of very small electronic devices can be achieved.

The packaged electronic device 201 can be used as the packaged electronic device for housing various kinds of electronic devices other than semiconductor devices, for example, a SAW (surface acoustic wave) filter or the like.

FIG. 16 to FIG. 21 are drawings showing the state of the packaged electronic device 201c in which the electronic device is mounted on the outer surface of the upper cover member 202 and which is mounted on a substrate 108. Of course, the packaged electronic device 201 shown in FIG. 7, the packaged electronic device 201a shown in FIG. 10, and the packaged electronic device 201b shown in FIG. 13 may be used in place of the packaged electronic device 201c.

Figure 16:
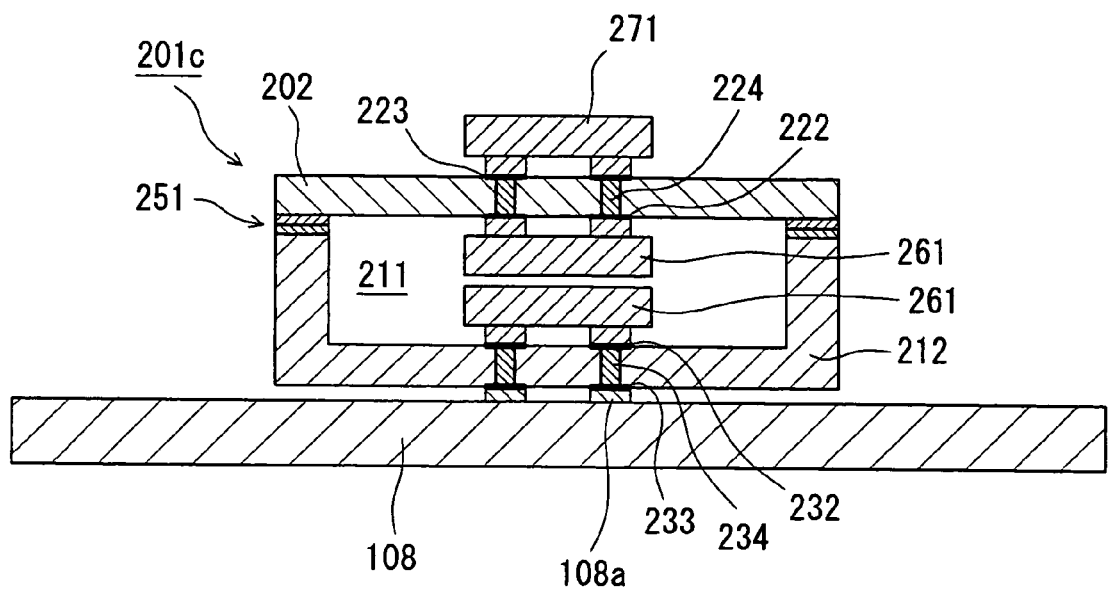
FIG. 16 is a drawing showing a state that the packaged electronic device according to the third to sixth embodiments is mounted on a substrate.
Figure 17:
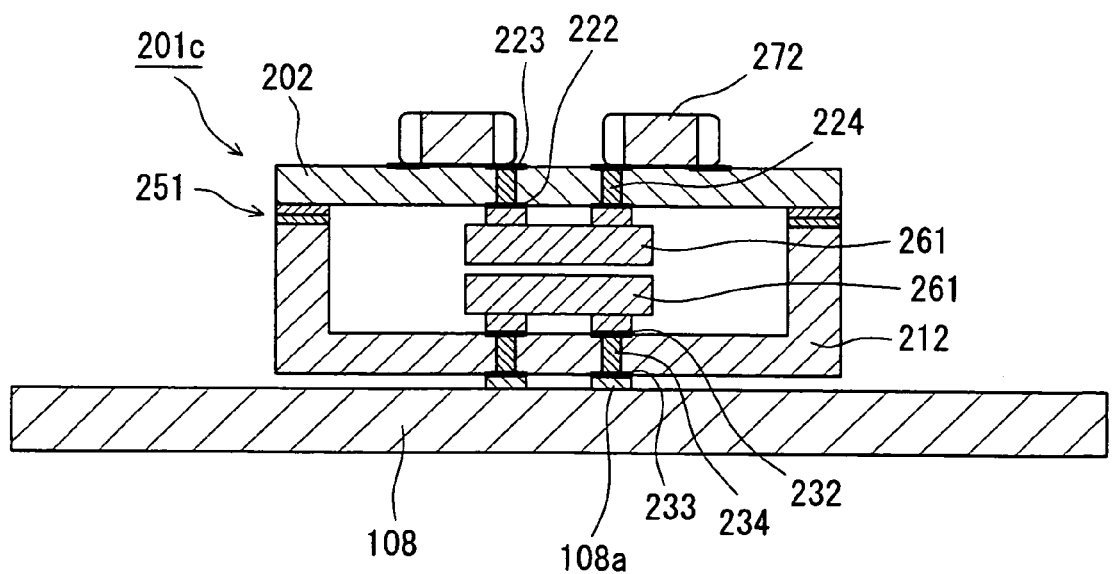
FIG. 17 is a drawing showing a state that the packaged electronic device according to the third to sixth embodiments is mounted on a substrate.
Figure 18:
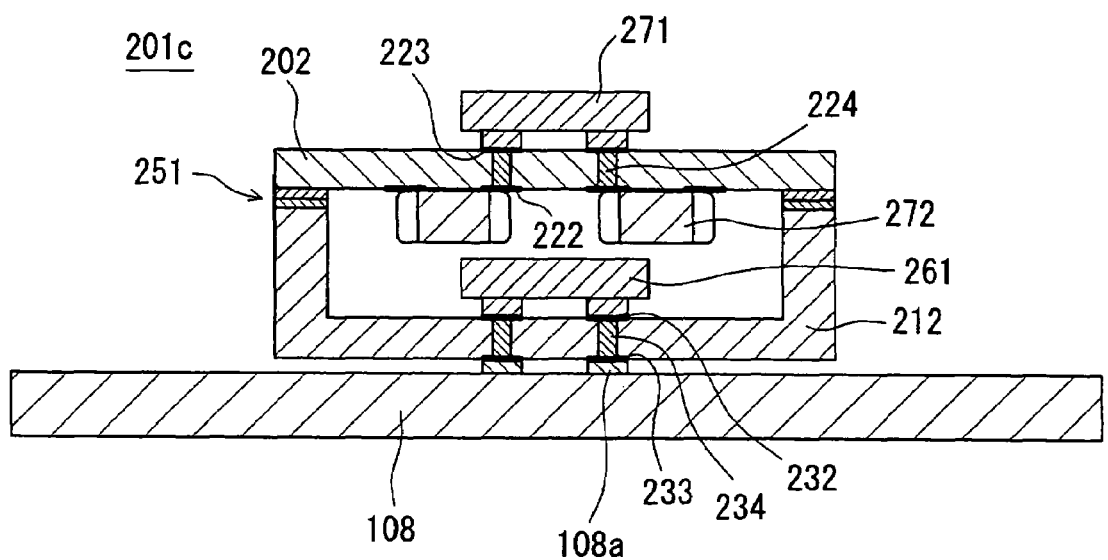
FIG. 18 is a drawing showing a state that the packaged electronic device according to the third to sixth embodiments is mounted on a substrate.
Figure 19:
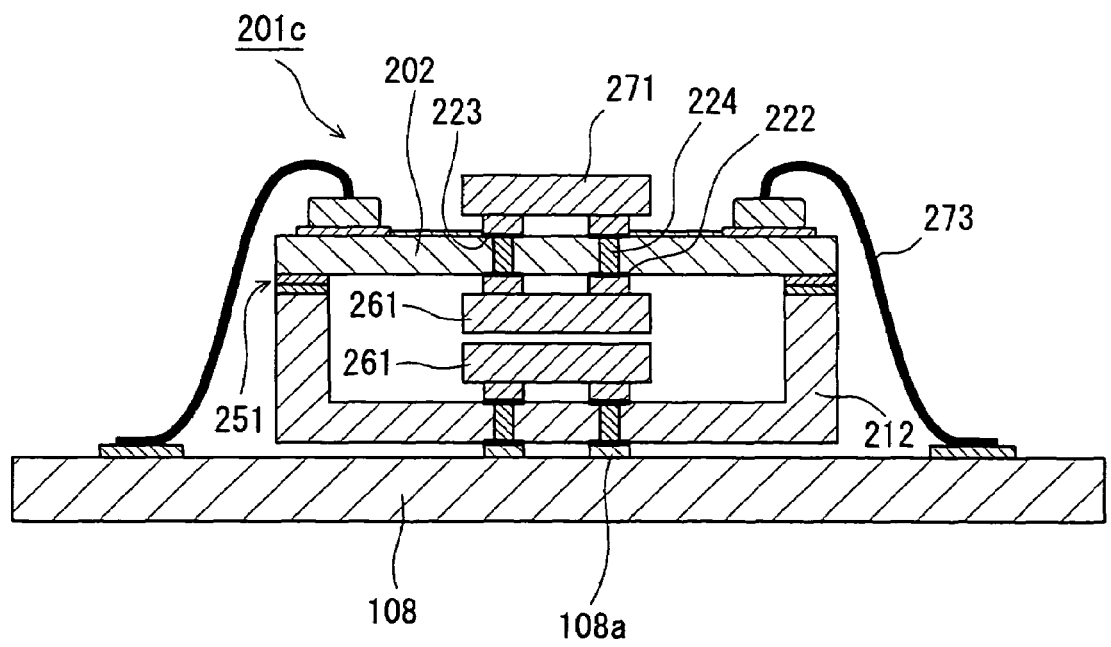
FIG. 19 is a drawing showing a state that the packaged electronic device according to the third to sixth embodiments is mounted on a substrate.
Figure 20:
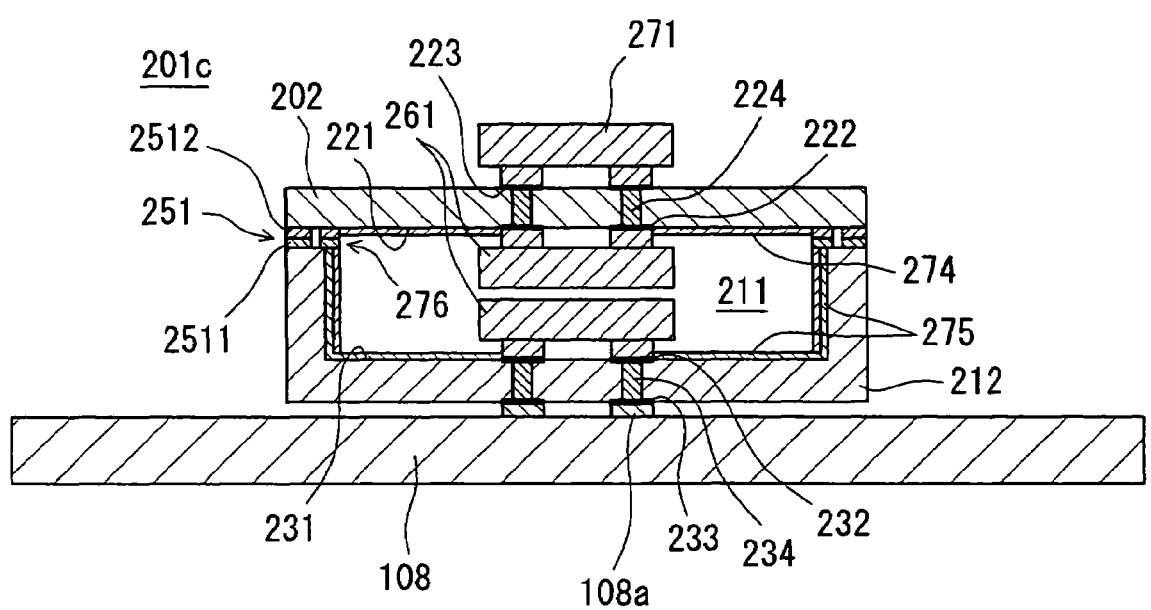
FIG. 20 is a drawing showing a state that the packaged electronic device according to the third to sixth embodiments is mounted on a substrate.
Figure 21:
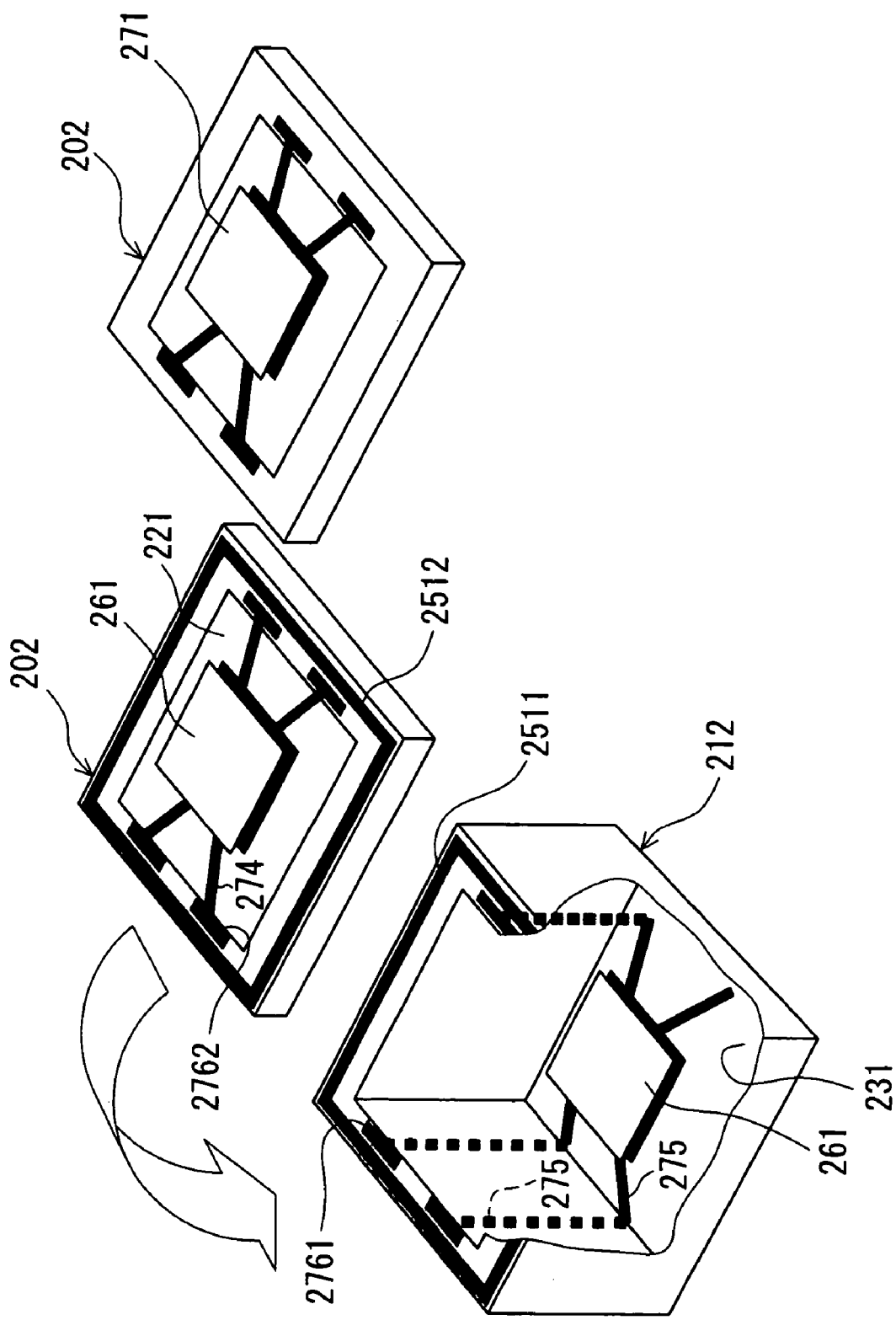
FIG. 21 is a drawing showing a state that the packaged electronic device according to the third to sixth embodiments is mounted on a substrate.

FIG. 16 shows the state a semiconductor device 271 is mounted on the outer surface of the upper cover member 202. FIG. 17 shows the state a chip part 272 is mounted on the outer surface of the upper cover member 202. FIG. 18 shows the state the chip part 272 is disposed in the inner space 211 as a modified example of the package shown in FIG. 17. The semiconductor device 271 and the chip part 272 correspond to a third electronic device. FIG. 19 shows the state wire bonding is carried out between the electrode formed on the outer surface of the upper cover member 202 and a gold wire 273 of the electrode of the substrate 108. FIG. 20 and FIG. 21 show the case that wiring is formed in the packaged electronic device 201c to electrically connect the electronic device mounted on the upper cover member 202 and the electronic device mounted on the cavity substrate 212. That is, as shown in FIG. 21, wiring 274 is formed on the face 221 of the inner space 211 side of the upper cover member 202 and wiring 275 is formed on the face 231 of the inner space 211 side of the cavity substrate 212 and in the inside of the cavity substrate 212. Also, a metal layer 276 for wiring is formed separately from the metal layer 251 bonding the upper cover member 202 and the cavity substrate 212. Similarly to the formation method of the metal layer 251, the metal layer 276 for wiring may be formed by radiating the FAB to a metal part 2762 formed on the upper cover member 202 and a metal part 2761 formed on the cavity substrate 212 and bonding them. Herein, the wiring 274 is connected to the metal part 2762 and the wiring 275 is connected to the metal part 2761. Therefore the wiring 274 and the wiring 275 are electrically connected through the metal layer 276 for wiring.

The third to sixth embodiments are also usable for various kinds of packaged electronic devices other than semiconductor devices and usable even for electronic devices with low heat resistance and low moisture resistance.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

INDUSTRIAL APPLICABILITY

The present invention is applicable for a packaged electronic device for housing semiconductor devices as well as various kinds of electronic devices.

The invention claimed is:

1. A manufacturing method of a packaged electronic device comprising:
   bonding a first container member on which an electronic device is mounted and a second container member configured to form a space for housing said electronic device in cooperation with said first container member with a metal layer for closing the space;
   when said bonding, radiating an energy wave to a first metal part of said first container member and a second metal part of said second container member while said first metal part and said second metal part are heated at a room temperature or higher and 150° C. or lower in atmospheric air; and
   forming said metal layer by bringing said first metal part and said second metal part radiated with said energy wave into contact with each other.

2. A packaged electronic device comprising:
   a container configured to form a closed inner space by a first inner face, a second inner face opposed to said first inner face, and side faces perpendicular to said first inner face and said second inner face;
   a first electronic device to be mounted on a first mounting face of said first inner face, said second inner face, or said side faces;
   a second electronic device to be mounted on a second mounting face different from said first mounting face of said first inner face, said second inner face, or said side faces;
   a first outer electrode formed on an outer face of said container facing to said first mounting face and configured to be electrically connected with said first electronic device; and
   a second outer electrode formed on an outer face of said container facing to said second mounting face and configured to be electrically connected with said second electronic device,
   said container including a recessed part; a main body member configured to mount said second electronic device on a bottom of said recessed part; a first cover member configured to be attached to an aperture of said recessed part and configured to mount said first electronic device; and a metal layer configured to close said inner space by bonding said main body member and said first cover member,
   said metal layer being formed by radiating an energy wave to metal parts of said main body member and said first cover member while said metal parts are heated at a room temperature or higher and 150° C. or lower in atmospheric air, and by bringing said radiated and heated metal parts into contact with each other.

3. A manufacturing method of a packaged electronic device comprising:
   mounting a first electronic device to be connected electrically with a first via on a first mounting face of a cover member having the first via formed therein;
   mounting a second electronic device to be connected electrically with a second via on a second mounting face of a main body member having the second via formed therein and forming a closed inner space in cooperation with said cover member; and
   forming a packaged electronic device by bonding said cover member and said main body member so as to arrange said first electronic device and said second electronic device in said inner space and thereby closing said inner space,
   said bonding of said cover member and said main body member being carried out by:
   radiating an energy wave to a first metal part formed on said first mounting face of said cover member and a second metal part formed on said main body member while said first metal part and said second metal part are heated at a room temperature or higher and 150° C. or lower in atmospheric air; and
   thereafter, forming said packaged electronic device by bonding said cover member and said main body member with said first metal part and said second metal part connected and closing said inner space.

4. The manufacturing method of a packaged electronic device according to claim 3, wherein said electric connection of said first and second vias with said first electronic device and said second electronic device is carried out by radiating an energy wave to said first and second vias, and electrodes of said first electronic device and said second electronic device; and thereafter bringing said first and second vias into contact with said first electronic device and said second electronic device.

5. The manufacturing method of a packaged electronic device according to claim 3, wherein said electric connection of said first and second vias with said first electronic device and said second electronic device is carried out by providing a curable anisotropic conductive or non-conductive resin between electrodes of said first electronic device and said second electronic device, and said first and second vias.

* * * * *